US012264272B2

(12) United States Patent
Arikawa et al.

(10) Patent No.: US 12,264,272 B2
(45) Date of Patent: Apr. 1, 2025

(54) FLUORESCENT MATERIAL COMPOSITE PARTICLES, WAVELENGTH CONVERTING MEMBER, LIGHT EMITTING DEVICE, METHOD FOR PRODUCING FLUORESCENT MATERIAL COMPOSITE PARTICLES, AND METHOD FOR PRODUCING WAVELENGTH CONVERTING MEMBER

(71) Applicant: NICHIA CORPORATION, Anan (JP)

(72) Inventors: Takuma Arikawa, Tokushima (JP); Masafumi Kuramoto, Tokushima (JP); Hiroki Inoue, Anan (JP)

(73) Assignee: NICHIA CORPORATION, Anan (JP)

( * ) Notice: Subject to any disclaimer, the term of this patent is extended or adjusted under 35 U.S.C. 154(b) by 410 days.

(21) Appl. No.: 17/808,031

(22) Filed: Jun. 21, 2022

(65) Prior Publication Data
US 2022/0403232 A1    Dec. 22, 2022

(30) Foreign Application Priority Data
Jun. 21, 2021    (JP) .................. 2021-102558

(51) Int. Cl.
| | |
|---|---|
| C09K 11/02 | (2006.01) |
| C08K 3/36 | (2006.01) |
| C08K 5/00 | (2006.01) |
| C09D 5/22 | (2006.01) |
| C09D 135/02 | (2006.01) |
| C09K 11/06 | (2006.01) |

(Continued)

(52) U.S. Cl.
CPC .............. *C09K 11/025* (2013.01); *C09D 5/22* (2013.01); *C09D 135/02* (2013.01); *C09K 11/06* (2013.01); *H10H 20/8512* (2025.01); *C08K 3/36* (2013.01); *C08K 5/0091* (2013.01); *C08K 2201/003* (2013.01); *C09K 2211/10* (2013.01); *C09K 2211/188* (2013.01); *G02B 6/005* (2013.01); *G02F 1/133617* (2013.01)

(58) Field of Classification Search
None
See application file for complete search history.

(56) References Cited

U.S. PATENT DOCUMENTS

| | | | |
|---|---|---|---|
| 9,443,998 | B2 | 9/2016 | Werner et al. |
| 11,043,618 | B2 | 6/2021 | Pickett et al. |

(Continued)

FOREIGN PATENT DOCUMENTS

| | | | |
|---|---|---|---|
| JP | 2016518468 | A | 6/2016 |
| JP | 2018203965 | A | 12/2018 |

(Continued)

*Primary Examiner* — Nduka E Ojeh
(74) *Attorney, Agent, or Firm* — Hunton Andrews Kurth LLP

(57) ABSTRACT

Fluorescent material composite particles include translucent inorganic particles having a volume average particle diameter in a range of 30 nm or more and 500 nm or less, fluorescent nanoparticles having an average particle diameter in a range of 5 nm or more and 25 nm or less, and a first resin. At least a part of each of the translucent inorganic particles are embedded in the first resin. The translucent inorganic particles are unevenly distributed to a surface of the fluorescent material composite particles. The fluorescent material composite particles have a volume average particle diameter in a range of 0.5 μm or more and 50 μm or less.

24 Claims, 24 Drawing Sheets

(51) Int. Cl.
*F21V 8/00* (2006.01)
*G02F 1/13357* (2006.01)
*H10H 20/851* (2025.01)

(56) References Cited

U.S. PATENT DOCUMENTS

| | | | | |
|---|---|---|---|---|
| 2013/0026416 | A1* | 1/2013 | Otsuka | C08G 83/001 |
| | | | | 525/327.1 |
| 2014/0264196 | A1 | 9/2014 | Werner et al. | |
| 2017/0018690 | A1 | 1/2017 | Werner et al. | |
| 2017/0125650 | A1 | 5/2017 | Pickett et al. | |
| 2018/0291267 | A1* | 10/2018 | Nagano | B82Y 40/00 |
| 2019/0002759 | A1* | 1/2019 | D'Amico | C09K 11/02 |
| 2019/0062633 | A1* | 2/2019 | Wakui | C09K 11/77346 |
| 2019/0198730 | A1 | 6/2019 | Pickett et al. | |
| 2019/0305193 | A1* | 10/2019 | Aoyagi | A23B 2/40 |
| 2020/0239770 | A1* | 7/2020 | Aomori | G02B 1/113 |

FOREIGN PATENT DOCUMENTS

| | | |
|---|---|---|
| JP | 6464215 B2 | 1/2019 |
| JP | 2019502272 A | 1/2019 |
| JP | 2019085575 A | 6/2019 |
| WO | 2012001938 A1 | 1/2012 |
| WO | 2017191714 A1 | 11/2017 |
| WO | 2019065068 A1 | 4/2019 |

\* cited by examiner

FLUORESCENT MATERIAL COMPOSITE PARTICLES, WAVELENGTH CONVERTING MEMBER, LIGHT EMITTING DEVICE, METHOD FOR PRODUCING FLUORESCENT MATERIAL COMPOSITE PARTICLES, AND METHOD FOR PRODUCING WAVELENGTH CONVERTING MEMBER

CROSS-REFERENCE TO RELATED PATENT APPLICATION

This application claims priority to Japanese Patent Application No. 2021-102558, filed on Jun. 21, 2021, the entire disclosures of which is incorporated herein by reference in their entirety.

BACKGROUND

Technical Field

The present invention relates to fluorescent material composite particles, a wavelength converting member, a light emitting device, a method for producing fluorescent material composite particles, and a method for producing a wavelength converting member.

Description of Related Art

Light emission by quantum dots (QD), which are semiconductor nanoparticles, has excellent chromatic purity. Quantum dots are excellent in quantum efficiency, and have been used as a fluorescent material for a wavelength converting film of a display excellent in color reproducibility. Display devices are being demanded to have higher image quality. Accordingly, wavelength converting members and color filters are demanded to conform to a wider color gamut as defined in the BT2020 standard. Fluorescent nanoparticles have a narrower full width at half maximum of a light emission spectrum having a light emission peak, are excellent in chromatic purity, and have a high quantum efficiency, as compared to the ordinary quantum dots, and thus are expected as a fluorescent material applied to wavelength converting members.

The fluorescent nanoparticles are readily decomposed with water, and thereby the light emission characteristics thereof are readily deteriorated. In the case where a wavelength converting member is formed by adding the fluorescent nanoparticles to a resin material, it is difficult to control the deterioration of the light emission characteristics of the fluorescent nanoparticles since water is readily diffused and permeated into the resin material. Accordingly, the wavelength converting member is used in some cases in the form of laminate including a resin layer including the fluorescent nanoparticles, having laminated on both surfaces thereof resin films having a barrier layer for protecting the resin layer from water and air. However, the lamination of the resin layer including the fluorescent nanoparticles with the resin films having a barrier layer is still insufficient for protecting the fluorescent nanoparticles from water and air.

For example, Japanese Unexamined Patent Publication No. 2016-518468 describes quantum dot beads including polymer beads, such as an acrylate, including quantum dots, having coated on the surface thereof layers of a metal oxide by an atomic layer deposition (ALD) method. Japanese Unexamined Patent Publication No. 2018-203965 describes fluorescent material-containing particles formed by dispersing granules of a resin containing a semiconductor nanoparticle fluorescent material, and a metal oxide, in a dispersion medium, and evaporating the dispersion medium to attach the metal oxide on the surface of the granules.

SUMMARY

Further improvements of particles including the fluorescent nanoparticles have been demanded for retaining the light emission characteristics.

Some embodiments of the present disclosure intend to provide fluorescent material composite particles capable of retaining high light emission characteristics of fluorescent nanoparticles, a wavelength converting member, a light emitting device, a method for producing fluorescent material composite particles, and a method for producing a wavelength converting member.

A first embodiment relates to fluorescent material composite particles including translucent inorganic particles having a volume average particle diameter in a range of 30 nm or more and 500 nm or less, fluorescent nanoparticles having an average particle diameter in a range of 5 nm or more and 25 nm or less, and a first resin, at least a part of each of the translucent inorganic particles being embedded in the first resin, the translucent inorganic particles being unevenly distributed to a surface of the fluorescent material composite particles, the fluorescent material composite particles having a volume average particle diameter in a range of 0.5 μm or more and 50 μm or less.

A second embodiment relates to fluorescent material composite particles including translucent inorganic particles having a volume average particle diameter in a range of 30 nm or more and 500 nm or less, fluorescent nanoparticles having an average particle diameter in a range of 5 nm or more and 25 nm or less, a first resin, and a film-like material containing an inorganic material transmitting light having a wavelength of 400 nm or more, at least a part of each of the translucent inorganic particles being embedded in the first resin, the translucent inorganic particles being unevenly distributed to a surface of the fluorescent material composite particles, the film-like material being disposed on at least a part of a surface of the translucent inorganic particles, the composite particles having a volume average particle diameter in a range of 0.5 μm or more and 50 μm or less.

A third embodiment relates to a wavelength converting member including the fluorescent material composite particles and a second resin.

A fourth embodiment relates to a light emitting device including the fluorescent material composite particles and an excitation light source.

A fifth embodiment relates to a light emitting device including the wavelength converting member and an excitation light source.

A sixth embodiment relates to a method for producing fluorescent material composite particles, including: preparing a first dispersion liquid, for example, to be a dispersed phase, containing fluorescent nanoparticles, a radically polymerizable monomer, and a polymerization initiator; preparing a second dispersion liquid, for example, to be a continuous phase, containing a suspension stabilizer including translucent inorganic particles, and an organic solvent; performing suspension polymerization by mixing the first dispersion liquid and the second dispersion liquid, in polymerizing the radically polymerizable monomer to form particles of a first resin including the fluorescent nanoparticles, fluorescent material composite particles including the translucent inorganic particles, wherein at least a part of each of the translucent inorganic particles is embedded in the first resin, the translucent inorganic particles being unevenly distributed to a surface of the fluorescent material composite particles, being formed through a pickering emulsion including the translucent inorganic particles existing at an oil/oil interface.

A seventh embodiment relates to a method for producing a wavelength converting member, including: disposing a composition for a wavelength converting sheet containing the fluorescent material composite particles and a second resin, on a surface of a translucent member.

An eighth embodiment relates to a method for producing a wavelength converting member, including: disposing a composition for a wavelength converting sheet containing the fluorescent material composite particles and a second resin, on a surface of a first translucent member; disposing a second translucent member to hold the composition for a wavelength converting sheet with the first translucent member; and bonding the first translucent member and the second translucent member with a wavelength converting sheet sandwiched therebetween.

Some embodiments of the present disclosure can provide fluorescent material composite particles capable of retaining high light emission characteristics of fluorescent nanoparticles, a wavelength converting member, a light emitting device, a method for producing fluorescent material composite particles, and a method for producing a wavelength converting member.

DETAILED DESCRIPTION

The fluorescent material composite particles, the wavelength converting member, the light emitting device, the method for producing fluorescent material composite particles, and the method for producing a wavelength converting member according to the present disclosure will be described with reference to illustrative embodiments below. However, the illustrative embodiments shown below are examples for realizing the technical concept of the present disclosure, and the present disclosure is not limited to the fluorescent material composite particles, the wavelength converting member, the light emitting device, the method for producing fluorescent material composite particles, and the method for producing a wavelength converting member shown below. The relationship between the color names and the chromaticity coordinates, and the relationship between the wavelength ranges of light and the color names of monochromatic light are in accordance with JIS Z8110. In the description herein, the terms "sheet", "film", "layer", and the like are not distinguished from each other based only on the difference in appellation. Accordingly, for example, a "film" may also be used as a meaning including a member that is referred to as a sheet, and a "sheet" may also be used as a meaning including a member that is referred to as a film.

The fluorescent material composite particles according to the first illustrative embodiment include translucent inorganic particles having a volume average particle diameter in a range of 30 nm or more and 500 nm or less, fluorescent nanoparticles having an average particle diameter in a range of 5 nm or more and 25 nm or less, and a first resin, the translucent inorganic particles are embedded by at least a part of each the translucent inorganic particles in the first resin and are unevenly distributed to the surface of composite particles, and the composite particles have a volume average particle diameter in a range of 0.5 μm or more and 50 μm or less.

Figure 1:
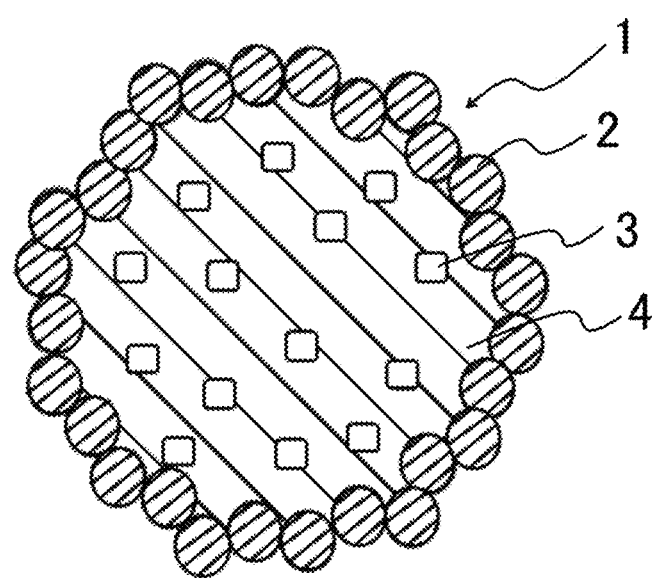
FIG. 1 is a schematic cross sectional view showing exemplary fluorescent material composite particles according to a first illustrative embodiment of the present disclosure.

The schematic configuration of the fluorescent material composite particles will be described with reference to the drawings. FIG. 1 is a schematic cross sectional view showing the first illustrative embodiment of the fluorescent material composite particles. A fluorescent material composite particle 1 includes translucent inorganic particles 2, fluorescent nanoparticles 3, and a first resin 4. In the fluorescent material composite particle 1, the fluorescent nanoparticles 3 are included in the particle of the first resin 4, and the translucent inorganic particles 2 are embedded by at least a part of each the translucent inorganic particles 2 in the first resin 4 and are unevenly distributed to the surface of the particle.

In the fluorescent material composite particle 1, the translucent inorganic particles 2 exist with substantially no gap on the surface of the composite particle of the first resin 4 including the fluorescent nanoparticles 3. The translucent inorganic particles 2 are unevenly distributed to the surface of the composite particle in the state where at least a part of each the translucent inorganic particles 2 are embedded in the first resin 4. In the fluorescent material composite particle 1, the translucent inorganic particles 2 are unevenly distributed to the surface of the composite particle of the first resin 4 including the fluorescent nanoparticles 3, in the state where at least a part of each of the translucent inorganic particles 2 are embedded therein with substantially no gap, and therefore water and the like are difficult to penetrate to the first resin 4, so as to protect the fluorescent nanoparticles 3 included in the first resin 4. The fluorescent nanoparticles 3 have a tetragonal or cubic crystal structure, and the crystal structure is readily decomposed with water. In the decomposition of the crystal structure with water, the light emission characteristics of the fluorescent nanoparticles 3 cannot be retained. The translucent inorganic particles 2 existing on the surface of the first resin 4 in the state where at least a part of each the translucent inorganic particles 2 are embedded the first resin 4 with substantially no gap enhance the effect of suppressing the penetration of water into the first resin 4, and the fluorescent material composite particle 1 can retain the light emission characteristics of the fluorescent nanoparticles 3.

Figure 23:
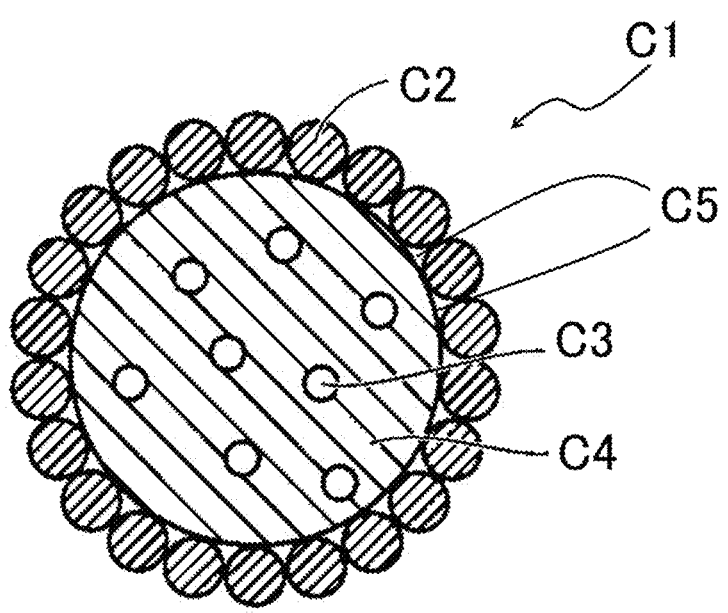
FIG. 23 is a schematic cross sectional view showing the fluorescent material-containing particles described in the related art document.

FIG. 23 is a schematic cross sectional view showing the schematic configuration of a fluorescent material-containing particle C1 described in Japanese Unexamined Patent Publication No. 2018-203965. In the fluorescent material-containing particle C1 described in Japanese Unexamined Patent Publication No. 2018-203965, granules of a resin C4 containing a structural unit derived from an ionic liquid having a polymerizable functional group, having semiconductor nanoparticles C3 dispersed the resin C4, and a metal oxide C2 are dispersed in a dispersion medium, which is then evaporated at a temperature of 30° C. or more and 150° C. or less, and thus the metal oxide C2 is attached to the surface of the granule of the resin C4 to form a layer of the metal oxide. In the fluorescent material-containing particle C1 described in Japanese Unexamined Patent Publication No. 2018-203965, the particles of the metal oxide C2 are attached to the surface of the granules of the resin C4, which have been formed into a particle with the semiconductor nanoparticles C3 included the resin C4, through drying of the dispersion medium, and therefore gaps C5 are formed between the surface of the granule of the resin C4 and the metal oxide C2. In the case where gaps exist between the granule of the resin C4 and the metal oxide C2, water readily penetrates through the gaps, and the semiconductor nanoparticles C3 in the resin C4 are decomposed with water to deteriorate the light emission characteristics of the semiconductor nanoparticles in some cases.

Figure 24:
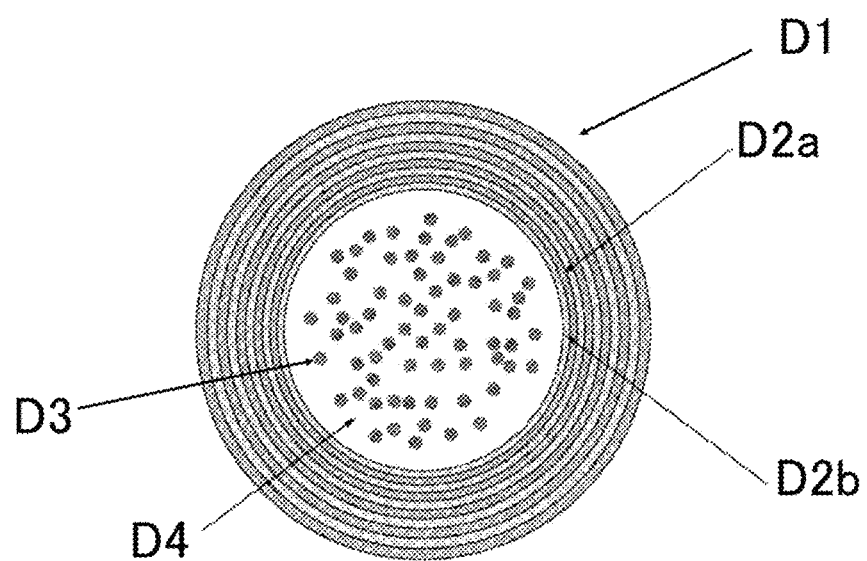
FIG. 24 is a schematic cross sectional view showing the quantum dot beads described in the related art document.

FIG. 24 is a schematic cross sectional view showing the schematic configuration of quantum dot beads D1 described in Japanese Unexamined Patent Publication No. 2016-518468. In the quantum dot bead D1 described in Japanese Unexamined Patent Publication No. 2016-518468, first surface coating layers D2a and second surface coating layers D2b are disposed by laminating alternately on the surface of the primary particle of a primary matrix material D4, such as a resin, having quantum dot nanoparticles D3 dispersed therein. The first surface coating layers D2a are formed, for example, with an inorganic material, such as a metal oxide, by the atomic layer deposition (ALD) method, and the second surface coating layers D2b are formed, for example, with an alkoxide alloy polymer by the ALD method. The surface coating layers are formed by the ALD method on the surface of the primary particle containing the quantum dot nanoparticles D3 and the primary matrix material D4, and therefore it is expected that the penetration of water is suppressed. However, there is a large difference in thermal expansion coefficient between the resin, which is the primary matrix material D4 constituting the primary particles, and, for example, the metal oxide constituting the surface coating layer D2a. In the case where the quantum dot beads D1 are repeatedly heated and cooled due to the presence and absence of irradiation of light from the excitation light source, exfoliation and cracks readily occur in the first surface coating layers D2a or the second surface coating layers D2b due to the difference in thermal expansion coefficient.

In the fluorescent material composite particles 1 according to the present illustrative embodiment, on the other hand, the translucent inorganic particles 2 exist on the surface of the particle of the first resin 4 including the fluorescent nanoparticles 3, in the state where at least a part of each the translucent inorganic particles 2 are embedded in the first resin 4. Even in the case where the fluorescent material composite particles 1 are repeatedly heated and cooled due to the presence and absence of irradiation of light from the excitation light source, the translucent inorganic particles 2 existing on the surface of the particle of the first resin 4 in the state where at least a part of each the translucent inorganic particles 2 are embedded the first resin 4 can expand and narrow the interval between the adjacent translucent inorganic particles 2 following expansion and contraction of the first resin 4. Even in the case where the thermal expansion coefficient of the translucent inorganic particles 2 and the thermal expansion coefficient of the first resin 4 are different from each other, the fluorescent material composite particles 1 can expand and narrow the interval between the adjacent translucent inorganic particles 2 following expansion and contraction of the first resin 4. According to the mechanism, exfoliation of the translucent inorganic particles 2 hardly occurs, and penetration of water into the first resin 4 can be suppressed, thereby retaining the high light emission characteristics of the fluorescent nanoparticles 3 included in the first resin 4.

The fluorescent material composite particles 1 according to the second illustrative embodiment include translucent inorganic particles having a volume average particle diameter in a range of 30 nm or more and 500 nm or less, fluorescent nanoparticles having an average particle diameter in a range of 5 nm or more and 25 nm or less, a first resin, and a film-like material containing an inorganic material transmitting light having a wavelength of 400 nm or more, the translucent inorganic particles are embedded by at least a part of each the translucent inorganic particles in the first resin and are unevenly distributed to a surface of particles, the film-like material is disposed on at least a part of a surface of the translucent inorganic particles, and the composite particles have a volume average particle diameter in a range of 0.5 μm or more and 50 μm or less.

Figure 2:
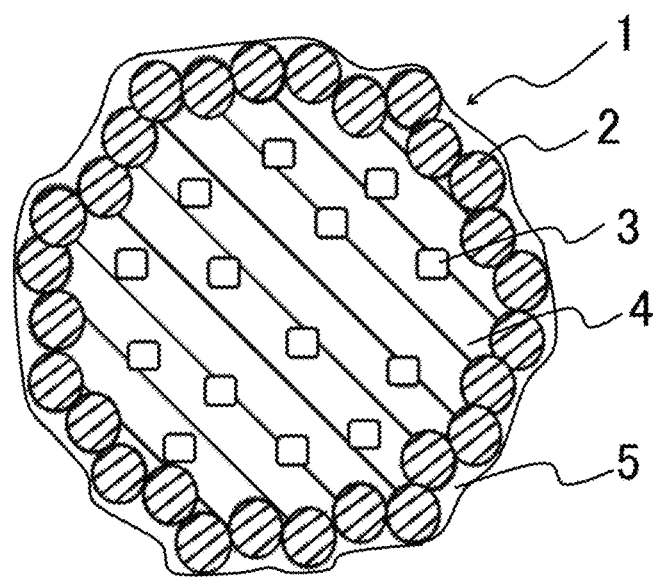
FIG. 2 is a schematic cross sectional view showing exemplary fluorescent material composite particles according to a second illustrative embodiment of the present disclosure.

FIG. 2 is a schematic cross sectional view showing the second illustrative embodiment of the fluorescent material composite particles. The fluorescent material composite particle 1 includes translucent inorganic particles 2, fluorescent nanoparticles 3, a first resin 4, and a film-like material 5. In the fluorescent material composite particle 1, the fluorescent nanoparticles 3 are included in the particle of the first resin 4, the translucent inorganic particles 2 are embedded by at least a part of each the translucent inorganic particles 2 in the first resin 4 and are unevenly distributed to the surface of the particle, and the film-like material 5 containing an inorganic material transmitting light having a wavelength of 400 nm or more is disposed on at least a part of a surface of the translucent inorganic particles 2.

In the fluorescent material composite particle 1, the translucent inorganic particles 2 are unevenly distributed to the surface of the particle of the first resin 4 including the fluorescent nanoparticles 3, in the state where at least a part of each the translucent inorganic particles 2 are embedded therein, and the film-like material 5 is disposed on at least a part of the surface of the translucent inorganic particles 2. Accordingly, penetration of water to the first resin 4 can be further suppressed, and the fluorescent nanoparticles 3 included in the first resin 4 can be further protected from water.

Translucent Inorganic Particles

The translucent inorganic particles have a volume average particle diameter in a range of 30 nm or more and 500 nm or less. In the description herein, the volume average particle diameter means an average particle diameter at a cumulative value of 50% in the volume based particle size distribution (i.e., the median diameter) measured by the laser diffraction method (which may also be referred to as the laser diffraction scattering method). The volume average particle diameter can be measured, for example, with a laser diffraction particle size distribution analyzer (e.g., Master Sizer 2000, manufactured by Malvern Panalytical Ltd.). The volume average particle diameter of the translucent inorganic particles may be a value shown in a brochure, as far as the value is a volume average particle diameter measured by the laser diffraction method. The volume average particle diameter of the translucent inorganic particles may be in a range of 50 nm or more and 400 nm or less, may be in a range of 80 nm or more and 300 nm or less, and may be in a range of 100 nm or more and 250 nm or less. In the case where the translucent inorganic particles have a volume average particle diameter in a range of 30 nm or more and 500 nm or less, the translucent inorganic particles can be embedded by at least a part of each the translucent inorganic particles on the surface of the first resin and can be unevenly distributed to the surface of the particles.

The translucent inorganic particles may comprise, consist essentially of, or consist of preferably at least one kind of an oxide or a fluoride selected from the group consisting of silicon dioxide, aluminum oxide, zirconium oxide, titanium oxide, and magnesium fluoride. The translucent inorganic particles preferably have a lower refractive index for facilitating the transmission of the excitation light and the light emitted from the fluorescent nanoparticles. The refractive index of the translucent inorganic particles is preferably 4.0 or less, more preferably 3.5 or less, further preferably 3.0 or less, and particularly preferably 2.5 or less. Silicon dioxide has a refractive index of 1.46, aluminum oxide has a refractive index of 1.77, zirconium oxide has a refractive index of 2.21, titanium oxide has a refractive index of 2.49, and magnesium fluoride has a refractive index of 1.38.

Fluorescent Nanoparticles

The fluorescent nanoparticles have an average particle diameter in a range of 5 nm or more and 25 nm or less. The average particle diameter of the fluorescent nanoparticles may be in a range of 6 nm or more and 22 nm or less, and may be in a range of 8 nm or more and 20 nm or less. The average particle diameter of the fluorescent nanoparticles can be obtained from a TEM image of the fluorescent nanoparticles obtained with a transmission electron microscope (TEM). Specifically, the diameter of the fluorescent nanoparticle means the longest one of line segments that each connect arbitrary two points on an outer circumference of a particle observed on the TEM image and pass through the center of the particle. The particle diameters of the measurable fluorescent nanoparticles observed on the TEM image are measured, and the arithmetic average of the particle diameters is designated as the average particle diameter of the fluorescent nanoparticles.

In the case where the particles of the fluorescent nanoparticles have a rod-like shape, the length of the short axis is assumed to be the particle diameter. The particle having a rod-like shape herein means a particle that is observed as a quadrangular shape including a rectangular shape (the cross section of which may be a circular shape, an ellipsoidal shape, or a polygonal shape), an ellipsoidal shape, a polygonal shape (e.g., a pencil-like shape), and has a ratio of the long axis to the short axis of more than 1.2. The length of the long axis of a particle having a rod-like shape with an ellipsoidal shape means the longest one of line segments that each connect arbitrary two points on the outer circumference of the particle, and the length of the long axis of a particle having a rod-like shape with a rectangular shape or a polygonal shape means the longest one of line segments that each are in parallel to the longest edge of the edges constituting the outer circumference of the particle and connect arbitrary two points on the outer circumference of the particle. The length of the short axis means the longest one of line segments that each connect arbitrary two points on the outer circumference of the particle and are perpendicular to the line segment designated as the length of the long axis. Specifically, the particle diameters of all the measurable nanoparticles observed on the TEM image at a magnification of 50,000 to 150,000 are measured, and the arithmetic average of the particle diameters is designated as the average particle diameter of the fluorescent nanoparticles. The measurable particle herein means a particle the whole of which can be observed on the TEM image. Accordingly, a particle that is included by only a part thereof in the imaging area of the TEM image and cut by the edge of the imaging area is not measurable. In the case where the number of the nanoparticles included in one TEM image is 100 or more, the average particle diameter is obtained with one TEM image. In the case where the number of the nanoparticles included in one TEM image is smaller, another TEM image is obtained by changing the imaging position, 100 or more particles included in two or more TEM images are measured for the particle diameter.

The fluorescent nanoparticles preferably contain a compound having a composition represented by the following formula (1).

$$[M^1_d A^1_e]_a M^2_b X_c \quad (1)$$

In the formula (1), $M^1$ represents at least one kind of element selected from the group consisting of Cs, Rb, K, Na, and Li; $A^1$ represents at least one kind of cation selected from the group consisting of an ammonium ion, a formamidinium ion, a guanidinium ion, an imidazolium ion, a pyridinium ion, a pyrrolidinium ion, and a protonated thiourea ion; $M^2$ represents at least one kind of element selected from the group consisting of Ge, Sn, Pb, Sb, and Bi; X represents at least one selected from the group consisting of a chloride, a bromide, an iodide, a cyanide, a thiocyanate, an isothiocyanate, and sulfide; a represents an integer of 1 to 4; b represents an integer of 1 to 2; c represents an integer of 3 to 9; d represents a number of 0 to 1; and e represents a number of 0 to 1, provided that d+e is 1. In the formula (1), in the case where both the first element $M^1$ and the organic cation $A^1$ are contained, both the first element $M^1$ and the organic cation $A^1$ represent an atomic group constituting a ligand.

An ammonium ion is represented by $[R_4N^+]$ (A-1), a formamidinium ion is represented by $[(NR_2)_2RC^+]$ (A-2), a guanidinium ion is represented by $[(NR_2)_3C^+]$ (A-3), and a protonated thiourea ion is represented by $[(NR_2)SHR_2N^+]$ (A-4). An imidazolium ion is represented by the following formula (A-5), a pyridinium ion is represented by the following formula (A-6), and a pyrrolidinium ion is represented by the following formula (A-7). In the formulae representing the organic cations, R each independently represent a hydrogen atom, an alkyl group having 1 to 4 carbon atoms, a phenyl group, a benzyl group, a halogen atom, or a pseudohalogen group.

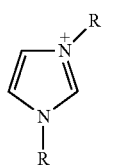

(A-5)

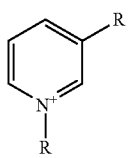

(A-6)

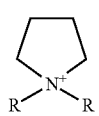

(A-7)

The fluorescent nanoparticles containing the compound having a composition represented by the formula (1) emit light with light from an excitation light source. It is preferred that the fluorescent nanoparticles are excited with light from an excitation light source having a light emission peak wavelength in a range of 380 nm or more and 500 nm or less, and emit light having a light emission peak wavelength in a range of more than 500 nm and 600 nm or less. It is possible that the fluorescent nanoparticles are excited with light having a light emission peak wavelength in a range of 380 nm or more and 500 nm or less, and emit light having a light emission peak wavelength in a range of 510 nm or more and 570 nm or less, or emit light having a light emission peak wavelength in a range of 520 nm or more and 560 nm or less.

The fluorescent nanoparticles containing the compound having a composition represented by the formula (1) have a high light absorbing capability, a high light emission intensity, and a brilliant light emission color. The compound having a composition represented by the formula (1) has a cubic perovskite crystal structure. The fluorescent nanoparticles containing the compound having a composition represented by the formula (1) have a light emission spectrum having a narrow full width at half maximum of the light emission spectrum showing the maximum light emission intensity and a good chromatic purity, and thereby the color reproducibility can be enhanced in the case where mixed light with light having another wavelength range is emitted. In the description herein, the full width at half maximum of the light emission spectrum means the wavelength width at which the light emission intensity is 50% with respect to the light emission intensity at the light emission peak wavelength showing the maximum light emission intensity. The fluorescent nanoparticles containing the compound having a composition represented by the formula (1) preferably has a narrow full width at half maximum in the light emission spectrum of the fluorescent nanoparticles, and the full width at half maximum is preferably 35 nm or less, more preferably 30 nm or less, and further preferably 25 nm or less.

The cubic perovskite crystal structure ideally has a cubic unit cell including the first chemical species formed of a first element $M^1$ and/or an organic cation $A^1$ constituting the vertices of the cubic crystal, and a second element $M^2$ constituting the body center of the cubic crystal, and second chemical species X formed of an anion or a ligand constitute an octahedron with the second element $M^2$ as the center. The second chemical species X constituting the octahedron are preferably disposed at each of the face centers of the cubic crystal. The octahedron constituted by the second chemical species X and the second element $M^2$ tends to strain through interaction with the first chemical species formed of the first element $M^1$ and/or the organic cation $A^1$, and has absent parts having no first chemical species or second chemical species existing in the crystal structure. The fluorescent nanoparticles containing the compound having a perovskite crystal structure are readily decomposed with water due to the presence of the strain and the absent parts of the compound having a perovskite crystal structure. The fluorescent nanoparticles included in the fluorescent material composite particles are suppressed from being decomposed with water and are protected with the first resin and the translucent inorganic particles embedded by at least a part of each the translucent inorganic particles in the first resin, and consequently the high light emission characteristics the translucent inorganic particles can be retained.

The fluorescent nanoparticles preferably contain a compound containing a chalcopyrite crystal structure. Examples of the compound containing a chalcopyrite crystal structure include a compound represented by the composition formula $AgInS_2$ having a cubic crystal structure. For the compound containing a chalcopyrite crystal structure for the fluorescent nanoparticles, reference can be made to the compounds described in Japanese Patent No. 6,464,215 and Japanese Unexamined Patent Publication No. 2019-085575 A.

The fluorescent nanoparticles containing the compound containing a chalcopyrite crystal structure emit light with light from an excitation light source. It is preferred that the fluorescent nanoparticles are excited with light from an excitation light source having a light emission peak wavelength in a range of 380 nm or more and 500 nm or less, and emit light having a light emission peak wavelength in a range more than 510 nm and 580 nm or less. It is possible that the fluorescent nanoparticles are excited with light having a light emission peak wavelength in a range of 380 nm or more and 500 nm or less, and emit light having a light emission peak wavelength in a range of 510 nm or more and 550 nm or less, or emit light having a light emission peak wavelength in a range of 515 nm or more and 545 nm or less. The full width at half maximum of the light emission spectrum of the fluorescent nanoparticles containing the compound having a chalcopyrite crystal structure may be 45 nm or less, may be 40 nm or less, and may be 35 nm or less. The case where light having a light emission spectrum having a relatively large full width at half maximum is emitted is excellent in capability to reveal the color of an object irradiated with the light.

First Resin

The first resin preferably contains a polymer obtained through polymerization of a radically polymerizable monomer. In the case where the first resin is a polymer obtained through polymerization of a radically polymerizable monomer, the first resin can include the fluorescent nanoparticles inside, and the fluorescent material composite particles including the translucent inorganic particles embedded by at least a part of each the translucent inorganic particles in the first resin and unevenly distributed to the surface of the particles of the first resin can be obtained.

The radically polymerizable monomer is preferably at least one kind of a monomer selected from the group consisting of an acrylate, a methacrylate, styrene, butadiene, isoprene, maleic anhydride, a maleic acid derivative, and a fumaric acid derivative.

Film-Like Material

The fluorescent material composite particles according to the second illustrative embodiment may have a film-like material containing an inorganic material transmitting light having a wavelength of 400 nm or more disposed on at least a part of a surface of the translucent inorganic particles embedded by at least a part of each the translucent inorganic particles in the first resin and unevenly distributed to a surface of the particles. The film-like material of the fluorescent material composite particles can further suppress the penetration of water from the outside, and can retain the crystal structure of the fluorescent nanoparticles included in the first resin, so as to retain the light emission characteristics of the fluorescent nanoparticles. The film-like material may transmit light having a wavelength of 850 nm or less.

The film-like material may preferably comprise, consist essentially of, or consist of at least one kind of an inorganic material selected from the group consisting of silicon dioxide, aluminum oxide, zirconium oxide, titanium oxide, and magnesium fluoride. The inorganic material contained in the film-like material may be the same kind as or a different kind from the translucent inorganic particles.

The thickness of the film-like material is preferably in a range of 10 nm or more and 500 nm or less, may be in a range of 20 nm or more and 300 nm or less, and may be in a range of 50 nm or more and 200 nm or less. The film-like material that has a thickness in a range of 10 nm or more and 500 nm or less can suppress the penetration of water to the first resin from the outside without suppressing transmission of the excitation light and the light emitted from the fluorescent nanoparticles, and can retain the crystal structure of the fluorescent nanoparticles, so as to retain the high light emission efficiency of the fluorescent nanoparticles.

The thickness of the film-like material provided in the fluorescent material composite particles can be measured in the following manner. The fluorescent material composite particles are buried in a resin, and the resin is cured and then cut to expose the cross sectional surfaces of the fluorescent material composite particles. Subsequently, the cut cross sectional surface is polished, and cut out with a focused ion beam (FIB) equipment. The cut out part is then observed with a scanning electron microscope (SEM). The dimension as the thickness of the film-like material can be measured from the SEM image obtained with SEM. The resin used for burying the fluorescent material composite particles may be an epoxy resin.

The volume average particle diameter of the fluorescent material composite particles is in a range of 0.5 µm or more and 50 µm or less. The volume average particle diameter of the fluorescent material composite particles means an average particle diameter at a cumulative value of 50% in the volume based particle size distribution (i.e., the median diameter) measured by the laser diffraction particle size distribution measurement method. The volume average particle diameter of the fluorescent material composite particles may be in a range of 1.0 µm or more and 40 µm or less, may be in a range of 2.0 µm or more and 35 µm or less, and may be in a range of 3.0 µm or more and 30 µm or less. In the case where the volume average particle diameter of the fluorescent material composite particles is in a range of 0.5 µm or more and 50 µm or less, good handleability can be obtained, and the fluorescent nanoparticles can be appropriately included in the first resin of the fluorescent material composite particles. Even in the case where the film-like material is provided on at least a part of the translucent inorganic particles, the volume average particle diameter of the fluorescent material composite particles is in a range of 0.5 µm or more and 50 µm or less.

Method for Producing Fluorescent Material Composite Particles

The method for producing fluorescent material composite particles includes: preparing a first dispersion liquid to be a dispersed phase, containing fluorescent nanoparticles, a radically polymerizable monomer, and a polymerization initiator; preparing a second dispersion liquid to be a continuous phase, containing a suspension stabilizer including translucent inorganic particles, and an organic solvent; and performing suspension polymerization by mixing the first dispersion liquid and the second dispersion liquid, and in polymerizing the radically polymerizable monomer to form particles of a first resin including the fluorescent nanoparticles, fluorescent material composite particles including the translucent inorganic particles being embedded by at least a part of each the translucent inorganic particles in the first resin and being unevenly distributed to a surface of particles are formed through a pickering emulsion including the translucent inorganic particles existing at an oil/oil interface.

Figure 3:
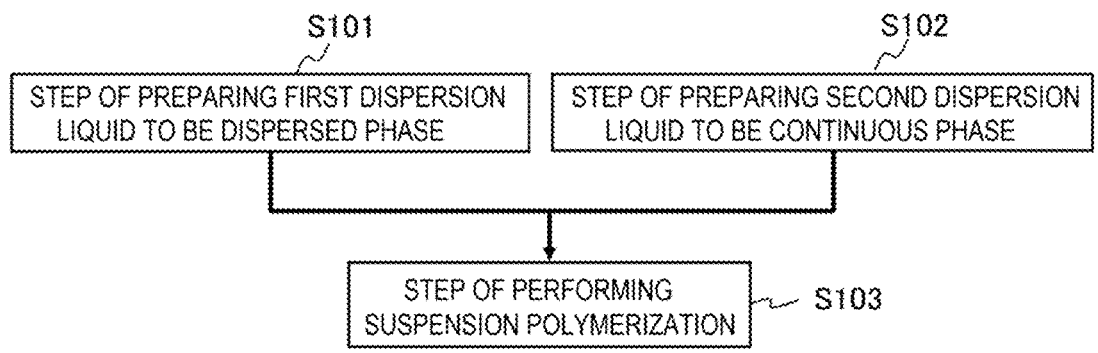
FIG. 3 is a flowchart showing an exemplary method for producing fluorescent material composite particles according to an illustrative embodiment of the present disclosure.

FIG. 3 is a flowchart showing the first illustrative embodiment of the method for producing fluorescent material composite particles. The method for producing fluorescent material composite particles includes a step S101 of preparing the first dispersion liquid to be a dispersed phase, containing fluorescent nanoparticles, a radically polymerizable monomer, and a polymerization initiator; a step S102 of preparing the second dispersion liquid to be a continuous phase, containing a suspension stabilizer including translucent inorganic particles, and an organic solvent; and a step S103 of performing suspension polymerization by mixing the first dispersion liquid and the second dispersion liquid.

Step of Preparing First Dispersion Liquid to be Dispersed Phase

The first dispersion liquid to be a dispersed phase contains fluorescent nanoparticles, a radically polymerizable monomer, and a polymerization initiator. The fluorescent nanoparticles used may be the aforementioned fluorescent nanoparticles having an average particle diameter in a range of 5 nm or more and 25 nm or less. The fluorescent nanoparticles preferably contain the compound represented by the formula (1).

The radically polymerizable monomer used may be the radically polymerizable monomer constituting the first resin. The radically polymerizable monomer is preferably at least one kind of a monomer selected from the group consisting of an acrylate, a methacrylate, styrene, butadiene, isoprene, maleic anhydride, a maleic acid derivative, and a fumaric acid derivative. Only one kind of the radically polymerizable monomer may be used alone, or two or more kinds of monomers may be used in combination.

The polymerization initiator may be one capable of initiating radical polymerization reaction. The polymerization initiator may be a photopolymerization initiator initiating polymerization reaction through irradiation of light, or may be a thermal polymerization initiator initiating polymerization reaction with heat. Examples of the photopolymerization initiator include an alkylphenone-based photopolymerization initiator, an acylphosphine oxide-based photopolymerization initiator, an oxime ester-based photopolymerization initiator, and a cation-based photopolymerization initiator. Examples of the alkylphenone-based photopolymerization initiator include 2-hydroxy-2-methyl-1-phenylpropanone and 1-hydroxycyclohexyl phenyl ketone. Examples of the commercially available product include Omnirad (registered trade name) 1173 and Omnirad (registered trade name) 184 (all manufactured by IGM Resins B.V.). Examples of the acylphosphine oxide-based photopolymerization initiator include diphenyl(2,4,6-trimethylbenzoyl)phosphine oxide (TPO) and bis(2,4,6-trimethylbenzoyl)phenylphosphine oxide (BAPO). Examples of the commercially available product include Omnirad (registered trade name) TPO (manufactured by IGM Resins B.V.) and BAPO (manufactured by Tokyo Kasei Kogyo Co., Ltd.). Examples of the oxime ester-based photopolymerization initiator include 1-[4-(phenylthio)phenyl]octan-1,2-dione 2-(O-benzoyloxime). Examples of the commercially available product include Irgacure (registered trade name) OXE01 (manufactured by BASF Japan, Ltd.). Examples of the cation-based photopolymerization initiator include a mixture of iodonium, (4-methylphenyl)[4-(2-methylpropyl)phenyl]hexafluorophosphate (1-), and propylene carbonate. Examples of the commercially available product include Omnicat (registered trade name) 250 (manufactured by IGM Resins B.V.). Examples of the thermal polymerization initiator include an azo-based thermal polymerization initiator and an organic peroxide-based thermal polymerization initiator. Examples of the azo-based thermal polymerization initiator include 2,2'-azobisisobutyronitrile (AIBN) and 2,2'-azobis(2,4-dimethylvaleronitrile) (ADVN). Examples of the organic peroxide-based thermal polymerization initiator include dilauroyl peroxide and t-hexyl peroxypivalate.

The first dispersion liquid to be a dispersed phase preferably has a content of the fluorescent nanoparticles in a range of 0.5% by mass or more and 10.0% by mass or less, a content of the radically polymerizable monomer in a range of 90% by mass or more and 99.5% by mass or less, and a content of the polymerization initiator in a range of 0.5% by mass or more and 2.0% by mass or less, all based on the total amount of the first dispersion liquid. In the case where the mixing amounts of the components constituting the first dispersion liquid are in the ranges, in forming particles of the first resin including the fluorescent nanoparticles by mixing with the second dispersion liquid to be a continuous phase described later to polymerize the radically polymerizable monomer through polymerization reaction, the translucent inorganic particles can be allowed to exist at the interface between the first resin and the continuous phase through a pickering emulsion including the translucent inorganic particles existing at the oil/oil interface. In the case where the mixing amounts of the components constituting the first dispersion liquid to be the dispersed phase are in the ranges, the fluorescent material composite particles having a volume average particle diameter in a range of 0.5 μm or more and 50 μm or less can be obtained. The first dispersion liquid may contain a dispersion medium having the fluorescent nanoparticles dispersed therein. Examples of the dispersion medium having the fluorescent nanoparticles dispersed therein include toluene.

The first dispersion liquid to be the dispersed phase is preferably agitated at 100 rpm to 500 rpm for 1 hour or more and 5 hours or less before mixing with the continuous phase. The agitating time of the first dispersion liquid may be 2 hours or more and 4 hours or less.

Step of Preparing Second Dispersion Liquid to be Continuous Phase

The second dispersion liquid to be a continuous phase contains a suspension stabilizer including translucent inorganic particles, and an organic solvent. The translucent inorganic particles used may be the aforementioned translucent inorganic particles having a volume average particle diameter of 30 nm or more and 500 nm or less. The translucent inorganic particles may comprise, consist essentially of, or consist of at least one kind of an oxide or a fluoride selected from the group consisting of silicon dioxide, aluminum oxide, zirconium oxide, titanium oxide, and magnesium fluoride.

The suspension stabilizer may contain a surfactant in addition to the translucent inorganic particles. Examples of the surfactant include a fluorine-based surfactant and a silicone-based surfactant. Specific examples of the fluorine-based surfactant include 008-Fluorosurfactant (manufactured by RAN Biotechnologies, Inc.) and FluoSurf (manufactured by Emulseo). Specific examples of the silicone-based surfactant include PEG-9 polydimethylsiloxyethyl dimethicone (KF-6028, manufactured by Shin-Etsu Chemical Co., Ltd.) and lauryl PEG-9 polydimethylsiloxyethyl dimethicone (KF-6038, manufactured by Shin-Etsu Chemical Co., Ltd.). The use of the surfactant contained as the suspension stabilizer in the second dispersion liquid to be a continuous phase regulates the surface tension at the oil/oil interface between the continuous phase and the dispersed phase, and can allow the translucent inorganic particles to exist at the interface between the first resin formed through polymerization of the radically polymerizable monomer contained in the dispersed phase, and the continuous phase.

The organic solvent used may be at least one kind selected from the group consisting of a dimethyl silicone oil, a methylphenyl silicone oil, an organic-modified silicone oil, a hydrofluoroether, and a fluorinated hydrocarbon. The organic-modified silicone oil used may be at least one kind of an organic-modified silicone oil selected from the group consisting of a polyether-modified silicone oil, an amino-modified silicone oil, a fluoroalkyl-modified silicone oil, and a mercapto-modified silicone oil. The fluorinated hydrocarbon used may be a hydrofluoroether or a perfluoroalkane, such as perfluorohexane. The commercially available product of the fluorinated hydrocarbon used may be Novec (registered trade name) 7500 (manufactured by 3M Company) for the hydrofluoroether. The perfluoroalkane used may be Fluorinert (registered trade name) FC-40, Fluorinert (registered trade name) FC-72, or Fluorinert (registered trade name) FC-75 (all manufactured by 3M Company). The use of the organic solvent in the second dispersion liquid to be a continuous phase suppresses water from being mixed in, so as to suppress the decomposition of the fluorescent nanoparticles with water in suspension polymerization, and the fluorescent material composite particles can be produced while retaining the light emission characteristics of the fluorescent nanoparticles.

The second dispersion liquid to be a continuous phase preferably contains the translucent inorganic particles in an amount of 0.5 part by mass or more and 10.0 parts by mass or less, which may be 1.0 part by mass or more and 8.0 parts by mass or less, and may be 2.0 parts by mass or more and 6.0 parts by mass or less, per 100 parts by mass in total of the first dispersion liquid to be the dispersed phase. In the case where the second dispersion liquid contains the translucent inorganic particles in an amount of 0.5 part by mass or more and 10.0 parts by mass or less per 100 parts by mass in total of the first dispersion liquid, the surface tension at the interface between the continuous phase and the dispersed phase in suspension polymerization is regulated, and in forming the particles of the first resin, the translucent inorganic particles can be allowed to exist at the oil/oil interface between the liquid droplets of the radically polymerizable monomer to be the first resin and the continuous phase through a pickering emulsion The second dispersion liquid is preferably agitated at 100 rpm to 5,000 rpm for 3 minutes or more and 2 hours or less. The agitating time of the second dispersion liquid may be 5 minutes or more and 1 hour or less.

Step of Performing Suspension Polymerization

Figure 4:
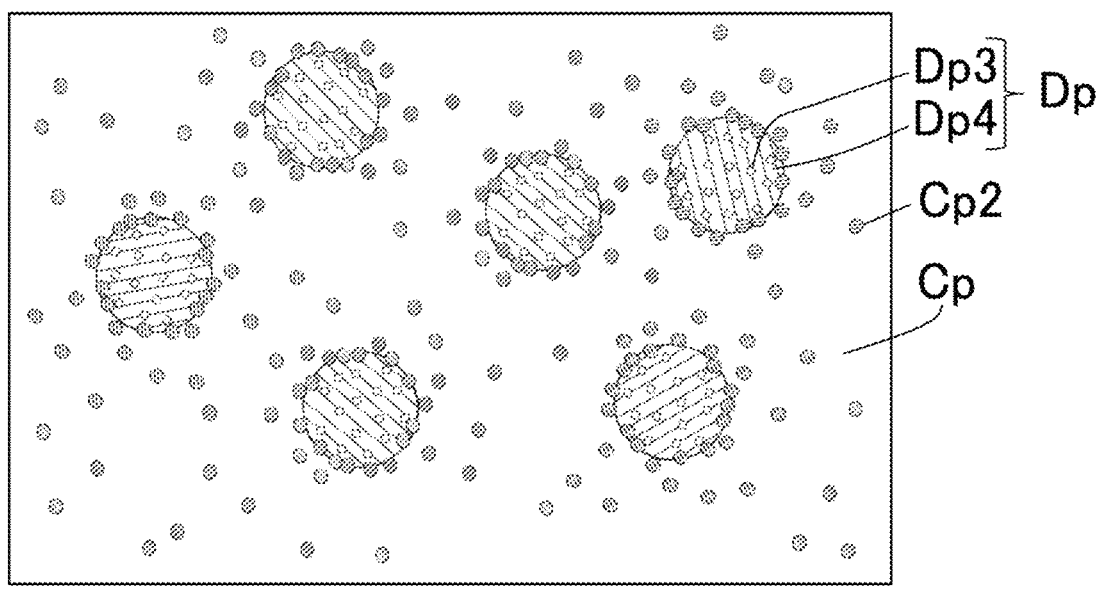
FIG. 4 is a schematic illustration showing an exemplary state of suspension polymerization.

The first dispersion liquid and the second dispersion liquid are mixed to form a suspension liquid containing the first dispersion liquid containing the fluorescent nanoparticles, the radically polymerizable monomer, and the polymerization initiator, constituting the dispersed phase, and the second dispersion liquid containing the translucent inorganic particles and the organic solvent, constituting the continuous phase. FIG. 4 is a schematic illustration showing the state of suspension polymerization. A continuous phase Cp includes translucent inorganic particles Cp2. A dispersed phase Dp includes a radically polymerizable monomer Dp4 and fluorescent nanoparticles Dp3.

By applying light or heat to the suspension liquid containing the dispersed phase Dp and the continuous phase Cp placed in a vessel, polymerization reaction of the radically polymerizable monomer Dp4 is started with the polymerization initiator in the dispersed phase Dp, and thereby particles of the first resin including the fluorescent nanoparticles are formed. In the formation of the particles of the first resin, the translucent inorganic particles Cp2 included in the continuous phase Cp are adsorbed to the oil/oil interface between the continuous phase Cp and the droplets of the radically polymerizable monomer Dp4 as the dispersed phase Dp through a pickering emulsion.

Figure 5:
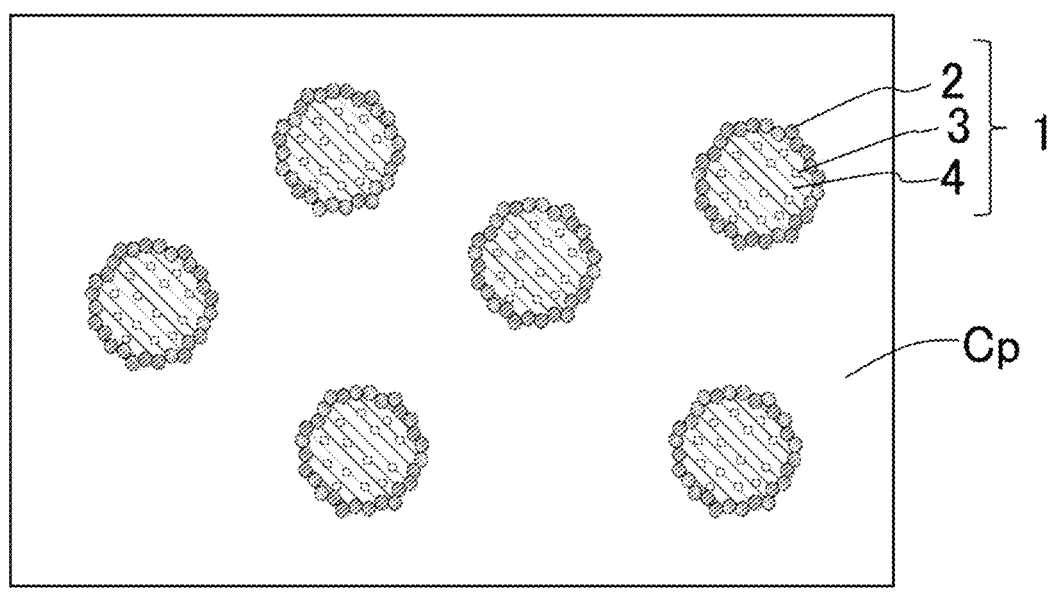
FIG. 5 is a schematic illustration showing an exemplary state where the fluorescent material composite particles are obtained through suspension polymerization.

FIG. 5 is a schematic illustration showing the state where the fluorescent material composite particles are obtained through suspension polymerization. The polymerization reaction of the radically polymerizable monomer proceeds in the state where the translucent inorganic particles are adsorbed to the oil/oil interface between the continuous phase Cp and the droplets of the radically polymerizable monomer Dp4 as the dispersed phase Dp through a pickering emulsion, and therefore the fluorescent material composite particles 1 are produced in the state where the translucent inorganic particles 2 are embedded in the first resin 4 formed through polymerization of the radically polymerizable monomer and are unevenly distributed to the surface of the particles. In the fluorescent material composite particles 1 obtained through the suspension polymerization, the translucent inorganic particles 2 embedded by at least a part of each the translucent inorganic particles 2 in the first resin exist with substantially no gap on the surface of the particles.

The method for producing fluorescent material composite particles preferably includes attaching a film-like material containing an inorganic material transmitting light having a wavelength of 400 nm or more to at least a part of the surface of the translucent inorganic particles.

Figure 6:
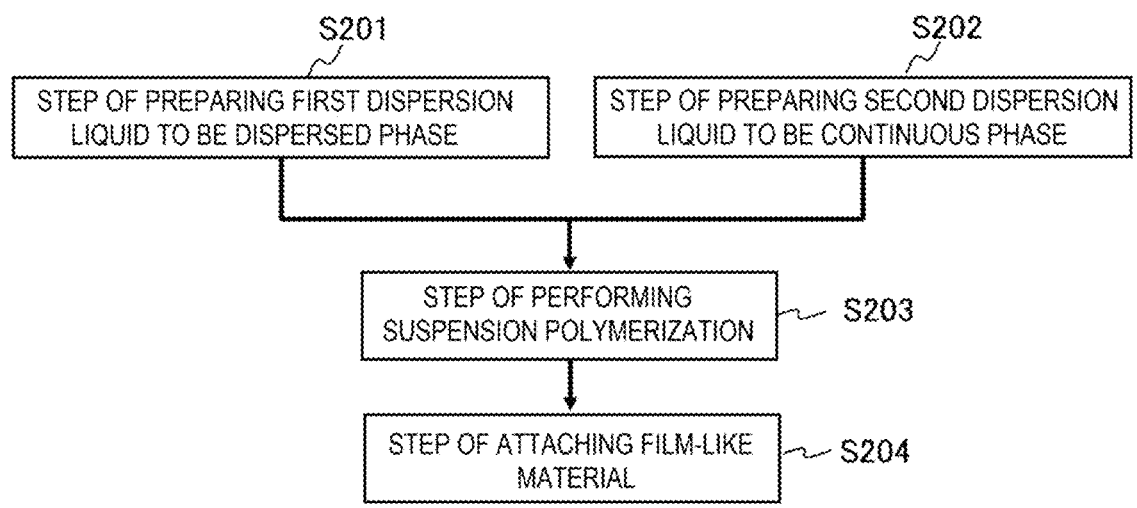
FIG. 6 is a flowchart showing an exemplary method for producing fluorescent material composite particles according to another illustrative embodiment of the present disclosure.

FIG. 6 is a flowchart showing the second illustrative embodiment of the method for producing fluorescent material composite particles. The method for producing fluorescent material composite particles includes a step S201 of preparing the first dispersion liquid to be a dispersed phase; a step S202 of preparing the second dispersion liquid to be a continuous phase; a step S203 of perform suspension polymerization by mixing the first dispersion liquid and the second dispersion liquid; and a step S204 of attaching a film-like material.

The production method preferably includes, before attaching the film-like material and after the suspension polymerization, separating the fluorescent material composite particles from the continuous phase and drying the composite particles. The fluorescent material composite particles separated from the continuous phase may be cleaned and then dried. The cleaning and solid-liquid separation may be repeated multiple times. In the case where the cleaning is performed multiple times, different cleaning liquids may be used in the first cleaning and the second or later cleaning, respectively. The cleaning liquid used is preferably an apolar solvent, such as toluene and hexane. The cleaning liquid used may also be a polar organic solvent, such as chloroform, methanol, ethanol, isopropyl alcohol, acetone, dimethylsulfoxide (DMSO), and N,N-dimethylformamide (DMF). Only one kind of the cleaning liquid may be used alone, or two or more kinds the cleaning liquid may be used as a mixture. The composite particles may be dried at a temperature in a range of 15° C. or more and 35° C. or less in an air atmosphere for 1 hour or more.

Step of Attaching Film-Like Material

In the method for producing fluorescent material composite particles, one embodiment of the step of attaching a film-like material may be a step of attaching a film-like material to the surface of the translucent inorganic particles of the fluorescent material composite particles by a sol-gel method. In the method for producing fluorescent material composite particles, another embodiment of the step of attaching a film-like material may be a step of attaching a film-like material to the surface of the translucent inorganic particles of the fluorescent material composite particles by an atomic layer deposition (ALD) method. The film-like material preferably contains at least one kind of an inorganic material selected from the group consisting of silicon dioxide, aluminum oxide, zirconium oxide, titanium oxide, and magnesium fluoride.

Attaching Film-Like Material by Sol-Gel Method

The fluorescent material composite particles may be made into contact with a solution containing a metal alkoxide containing at least one kind of an element selected from the group consisting of Si, Al, Zr, and Ti, and the metal alkoxide is hydrolyzed and polycondensated to attach an oxide containing at least one kind of an element selected from the group consisting of Si, Al, Zr, and Ti thereto. According to the sol-gel method, the fluorescent material composite particles may be made into contact with a solution containing a metal alkoxide, and the metal alkoxide is hydrolyzed and polycondensated to attach at least one kind of an oxide selected from the group consisting of silicon dioxide, aluminum oxide, zirconium oxide, titanium oxide and magnesium fluoride as a major component to the surface of the translucent inorganic particles, preferably in a film form, thereby resulting in the fluorescent material composite particles having the film-like material. In the description herein, the major component means that at least one kind of an oxide selected from the group consisting of silicon dioxide, aluminum oxide, zirconium oxide, and titanium oxide is contained in the film-like material in an amount of 50% by volume or more. The film-like material functions as a protective film, and suppresses the penetration of water from the outside, in cooperation with the translucent inorganic particles embedded by at least a part of each he translucent inorganic particles on the surface of the particles of the first resin and unevenly distributed thereto, and thus the light emission characteristics of the fluorescent nanoparticles in the first resin can be retained.

The metal alkoxide is preferably a silane compound having two or more alkoxy groups, and specific examples include methyltrimethoxysilane, methyltriethoxysilane, ethyltrimethoxysilane, ethyltriethoxysilane, propyltrimethoxysilane, propyltriethoxysilane, tetramethoxysilane, tetraethoxysilane, tetrapropoxysilane, titanium tetrapropoxide, titanium tetrabutoxide, aluminum triethoxide, aluminum tripropoxide, aluminum tributoxide, zirconium tetrapropoxide, and zirconium tetrabutoxide. The metal alkoxide is preferably tetraethoxysilane in consideration of the workability and the availability.

The solution containing the metal alkoxide preferably contains an organic solvent in consideration of the workability. The organic solvent contained in the solution containing the metal alkoxide is preferably a polar organic solvent, and examples include ethyl acetate, tetrahydrofuran, N,N-diethylformamide, dimethylsulfoxide, an alcohol having a linear or branched alkyl group having 1 to 8 carbon atoms, a carboxylic acid, such as formic acid and acetic acid, and a ketone, such as acetone. The polar organic solvent may be preferably a lower alcohol or ketone having a linear or branched alkyl group having 1 to 3 carbon atoms. The polar organic solvent may be more preferably ethanol or a ketone having a dielectric constant of 18 to 33. Specifically, the polar organic solvent is more preferably at least one kind selected from the group consisting of methanol (dielectric constant: 33), ethanol (dielectric constant: 24), 1-propanol (dielectric constant: 20), 2-propanol (dielectric constant: 18), and acetone (dielectric constant: 21). By adding an acid or alkali catalyst to the solution containing the metal alkoxide, the decomposition rate of the hydrolysis of the metal alkoxide can be increased. Examples of the solution of an acid or an alkali functioning as the catalyst include a hydrochloric acid solution and aqueous ammonia.

Attaching Film-Like Material by Atomic Layer Deposition Method

By forming the film-like material on the surface of the translucent inorganic particles of the fluorescent material composite particles by the atomic layer deposition method, the film-like material having a uniform thickness can be formed with no gap on the surface of the fluorescent material composite particles. The film-like material functions as a protective film, and suppresses the evaporation of water contained in the fluorescent material composite particles and the penetration of water from the outside, and thus the high light emission efficiency can be retained. In the formation of the film-like material by the atomic layer deposition method, for example, the fluorescent material composite particles are introduced to an atomic layer deposition equipment, subsequently for example, trimethylaluminium (TMA) gas is introduced to the atomic layer deposition equipment, and OH groups on the surface of the translucent inorganic particles on the surface of the fluorescent material composite particles are reacted with TMA. The excess gas is exhausted. Thereafter, $H_2O$ gas is introduced, and TMA bonded to the OH groups in the preceding reaction is reacted with $H_2O$. The excess gas is exhausted. The cycle of the reaction with TMA, the exhaust, the reaction with the OH groups, and the exhaust is repeated, so as to form a protective film, for example, of $Al_2O_3$ having a prescribed thickness. The protective film may also be formed by introducing $H_2O_2$ gas or ozone ($O_3$) instead of the $H_2O$ gas. The film-like material formed by the atomic layer deposition method preferably contains at least one kind of an inorganic material selected from the group consisting of silicon dioxide, aluminum oxide, zirconium oxide, titanium oxide, and magnesium fluoride.

The method for producing fluorescent material composite particles may include, after forming the film-like material on the surface of the translucent inorganic particles of the fluorescent material composite particles, heat-treating at a temperature of 40° C. or more and 120° C. or less. By the heat treatment at a temperature of 40° C. or more and 120° C. or less performed after forming the film-like material on the surface of the translucent inorganic particles of the fluorescent material composite particles, the film-like material is closely adhered to the surface of the translucent inorganic particles. The film-like material functions as a protective film, and suppresses the penetration of water from the outside, and thus the high light emission efficiency of the fluorescent nanoparticles can be retained. The method for producing fluorescent material composite particles preferably includes heat-treating at a temperature of 40° C. or more and 120° C. or less in the case where the film-like material is formed by the sol-gel method. The period of time of the heat treatment of the film-like material is preferably 0.5 hour or more and 48 hours or less, and may be 0.5 hour or more and 24 hours or less. The fluorescent material composite particles can be thus obtained.

Wavelength Converting Member

The wavelength converting member using the fluorescent material composite particles will be described. The wavelength converting member includes the fluorescent material composite particles and a second resin. The wavelength converting member including the fluorescent material composite particles and a second resin may be formed in such a manner that a composition for a wavelength converting member containing the fluorescent material composite particles and a second resin is dropped on a molded article having a recessed portion of a light emitting device according to a first configuration example described later, and then the second resin is cured to provide a wavelength converting member.

Second Resin

The second resin used may be at least one kind of a resin selected from the group consisting of a silicone resin, an epoxy resin, a phenol resin, a polycarbonate resin, an acrylic resin, and modified resins.

The wavelength converting member may be in the form of sheet. The wavelength converting member may be formed in such a manner that the composition containing the fluorescent material composite particles and the second resin is formed into a sheet, and the second resin is cured to provide a wavelength converting sheet.

Figure 7:
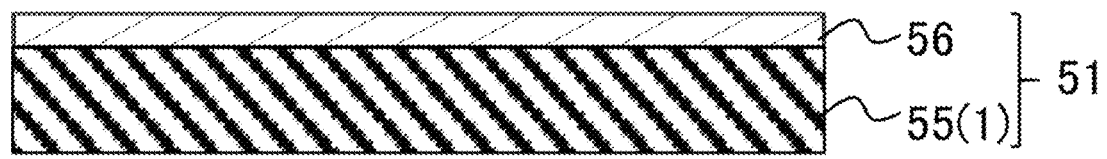
FIG. 7 is a schematic cross sectional view showing an exemplary wavelength converting member according to an illustrative embodiment of the present disclosure.

FIG. 7 is a schematic cross sectional view showing one example of the wavelength converting member in the form of sheet. A wavelength converting member 51 may have a wavelength converting sheet 55 including the fluorescent material composite particles 1 and the second resin, and a translucent member 56 containing a resin. The wavelength converting member 51 may have a translucent member 56 in the form of sheet at least one surface of an incident surface and an emission surface of the wavelength converting sheet 55.

Figure 8:
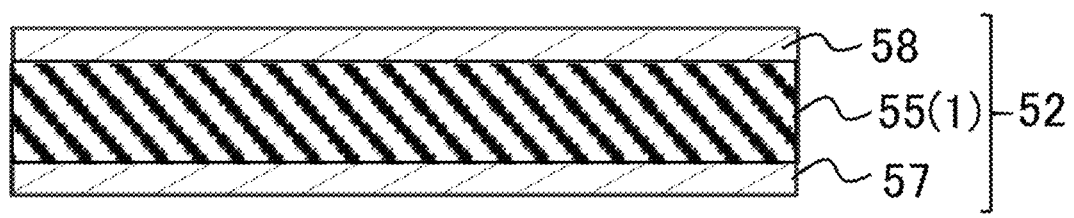
FIG. 8 is a schematic cross sectional view showing an exemplary wavelength converting member according to another illustrative embodiment of the present disclosure.

FIG. 8 is a schematic cross sectional view showing another example of the wavelength converting member in the form of sheet. A wavelength converting member 52 may include a wavelength converting sheet 55 including the fluorescent material composite particles 1 and the second resin, and a first translucent member 57 in the form of sheet and a second translucent member 58 in the form of sheet on both surfaces of an incident surface and an emission surface of the wavelength converting sheet 55. The first translucent member 57 and the second translucent member 58 each may have a barrier layer on the side of the wavelength converting sheet 55.

The content of the fluorescent material composite particles in the wavelength converting sheet is preferably 1.0 part by mass or more and 20 parts by mass or less, may be 1.0 part by mass or more and 10 parts by mass or less, and may be 1.0 part by mass or more and 5.0 parts by mass or less, per 100 parts by mass of the resin contained in the wavelength converting sheet.

The thickness of the wavelength converting sheet is preferably in a range of 30 μm or more and 800 μm or less, more preferably in a range of 50 μm or more and 500 μm or less, and further preferably in a range of 70 μm or more and 400 μm or less. In the case where the thickness of the wavelength converting sheet is in the prescribed range, the fluorescent material containing the fluorescent material composite particles in such an amount that can provide light having a desired color tone can be contained in the wavelength converting sheet.

The translucent member contains a resin and also functions as a protective member for the wavelength converting sheet. The translucent member may include plural layers of different resins and may also include a barrier layer. Examples of the barrier layer include a gas barrier layer and a water vapor barrier layer. The translucent member may have an antistatic layer and a bonding layer. The translucent member may have a bonding layer between the wavelength converting sheet and the translucent member. Examples of the resin constituting the translucent member include a polyester-based resin. Examples of the barrier layer include a layer containing at least one kind of an oxide selected from the group consisting of silicon dioxide, aluminum oxide, zirconium oxide, magnesium oxide, titanium oxide, cerium oxide, zinc oxide, and tin oxide. The barrier layer may contain two or more kinds of oxides. Examples of the resin constituting the bonding layer include at least one kind of a resin selected from the group consisting of an acrylic-based resin, a polyisophthalate resin, and a urethane-based resin. Examples of the substance constituting the gas or water vapor barrier layer include an inorganic oxide, such as silicon dioxide and aluminum oxide. Examples of the resin constituting the antistatic layer include a polyimide resin.

The wavelength converting member includes the fluorescent material composite particles as the first fluorescent material, and may further include, as the second fluorescent material, a fluorescent material having a light emission peak wavelength in a different wavelength range from the light emission peak wavelength of the fluorescent material composite particles. The wavelength converting member that includes the fluorescent material composite particles as the first fluorescent material and the second fluorescent material having a different light emission peak wavelength from the first fluorescent material can emit desired mixed light in the case where the wavelength converting member is used in a light emitting device.

Second Fluorescent Material

The wavelength converting member preferably includes at least one kind of a fluoride fluorescent material selected from the group consisting of a fluoride fluorescent material having a composition represented by the following formula (2a) and a fluoride fluorescent material having a composition represented by the following formula (2b).

$$A^2{}_g[M^3{}_{1-f}Mn^{4+}{}_fF_h] \quad (2a)$$

In the formula (2a), $A^2$ contains at least one kind selected from the group consisting of $K^+$, $Li^+$, $Na^+$, $Rb^+$, $Cs^+$, and $NH_4^+$; $M^3$ contains at least at least one of Si and Ge, and contains at least one element selected from the group consisting of Group 4 elements and Group 14 elements; f satisfies $0<f<0.2$; g represents the absolute value of charge of the $[M^3{}_{1-f}Mn^{4+}{}_fF_h]$ ion; and h satisfies $5<h<7$. Examples include $K_2SiF_6$:Mn (which may be referred to as "KSF").

$$A^{2'}{}_{g'}[M^{3'}{}_{1-f'}Mn^{4+}{}_{f'}F_{h'}] \quad (2b)$$

In the formula (2b), $A^{2'}$ contains at least one kind selected from the group consisting of $K^+$, $Li^+$, $Na^+$, $Rb^+$, $Cs^+$, and $NH_4^+$; $M^{3'}$ contains at least Si and Al, and contains at least one element selected from the group consisting of Group 4 elements, Group 13 elements, and Group 14 elements; f' satisfies $0<f'<0.2$; g' represents the absolute value of charge of the $[M^{3'}{}_{1-f'}Mn^{4+}{}_{f'}F_{h'}]$ ion; and h' satisfies $5<h'<7$. Examples include $K_2(Si,Al)F_{5.5}$:Mn (which may be referred to as "KSAF").

The amount of the second fluorescent material contained in the wavelength converting member may be appropriately selected depending on the desired color tone of mixed light emitted from the light emitting device. The content of the second fluorescent material is preferably in a range of 1.0 part by mass or more and 20 parts by mass or less, may be in a range of 1.0 part by mass or more and 10 parts by mass or less, and may be 1.0 part by mass or more and 5.0 parts by mass or less, per 100 parts by mass of the resin contained in the wavelength converting member or the wavelength converting sheet.

The wavelength converting member or the wavelength converting sheet may further include a filler, a light diffusing material, and the like, in addition to the resin and the fluorescent materials. The filler and the light diffusing material contained can relax the directionality of light from the light emitting element, and can enhance the viewing angle.

Method for Producing Wavelength Converting Member

The method for producing a wavelength converting member according to the first illustrative embodiment includes: forming a wavelength converting sheet with a composition for a wavelength converting sheet containing the fluorescent material composite particles and a second resin, on a surface of a translucent member. Examples of the formation method of the wavelength converting sheet include a printing method and a compression molding method. In the case where the wavelength converting sheet is formed by a printing method, the composition for a wavelength converting sheet is coated on a base material, and cured to form the wavelength converting sheet.

The method for producing a wavelength converting member according to the second illustrative embodiment includes: disposing a composition for a wavelength converting sheet containing the fluorescent material composite particles and a second resin, on a surface of a first translucent member; disposing a second translucent member to hold the composition for a wavelength converting sheet with the first translucent member; and bonding the first translucent member and the second translucent member with a wavelength converting sheet intervening therebetween.

At least one of a translucent member of the translucent member, the first translucent member, and the second translucent member may have a barrier layer. In the case where the translucent member includes plural layers including a barrier layer, the barrier layer is preferably disposed to the side close to the wavelength converting sheet.

The barrier layer may be formed by a vapor deposition method, such as a physical vapor deposition (PVD) method or a chemical vapor deposition (CVD) method. The thickness of the barrier layer is not particularly limited, and may be in a range of 0.1 nm or more and 500 nm or less, may be in a range of 1 nm or more and 300 nm or less, and may be in a range of 5 nm or more and 100 nm or less.

Light Emitting Device

A light emitting device including the fluorescent material composite particles will be described. The light emitting device includes the fluorescent material composite particles and an excitation light source. The fluorescent material composite particles may be used as a constitutional element of a wavelength converting member. The light emitting device may include a wavelength converting member including the fluorescent material composite particles, and an excitation light source.

Light Emitting Device of First Configuration Example

Figure 9:
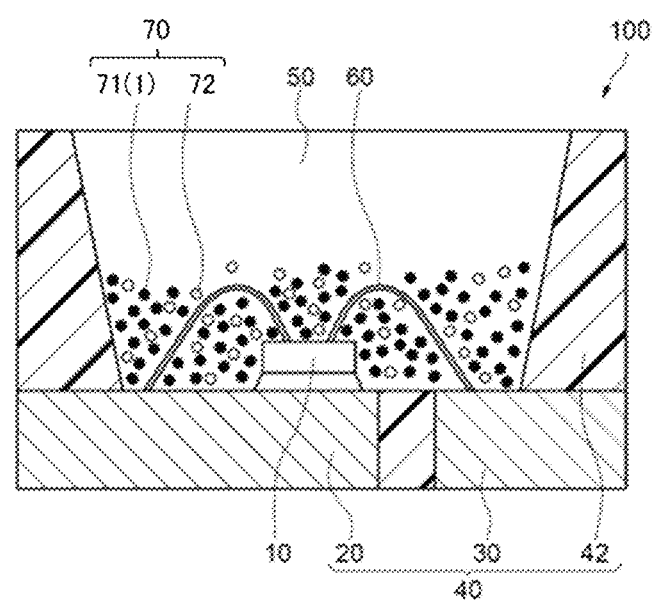
FIG. 9 is a schematic cross sectional view showing a light emitting device according to an illustrative embodiment of the present disclosure.

Illustrative embodiments of the light emitting device will be described with reference to the drawings. FIG. 9 is a schematic cross sectional view showing the first illustrative embodiment of the light emitting device.

A light emitting device 100 includes a molded article 40 having a recessed portion, a light emitting element 10 as a light source, and a fluorescent member 50 covering the light emitting element 10. The molded article 40 includes a first lead 20, a second lead 30, and a resin part 42 containing a thermoplastic resin or a thermosetting resin, which are integrally molded. The molded article 40 includes the first lead 20 and the second lead 30 disposed to constitute the bottom surface of the recessed portion, and the resin part 42 disposed to constitute the side surface of the recessed portion. The light emitting element 10 is disposed on the bottom surface of the recessed portion of the molded article 40. The light emitting element 10 has one pair of anode and cathode, and the one pair of anode and cathode are electrically connected to the first lead 20 and the second lead 30, respectively, with wires 60. The light emitting element 10 is covered with the fluorescent member 50. The fluorescent member 50 contains a fluorescent material 70 converting the wavelength of light emitted from the light emitting element 10. The fluorescent material 70 contains the fluorescent material composite particles 1 as a first fluorescent material 71. The fluorescent material 70 may contain a second fluorescent material 72 having a light emission peak wavelength that is different in wavelength range from the light emission peak wavelength of the first fluorescent material.

Light Emitting Element

A light emitting element may be used as a light source. The light emitting element may emit light in a wavelength range of 380 nm or more and 500 nm or less. The light emission peak wavelength of the light emitting element may be in a range of 400 nm or more and 490 nm or less, and is more preferably in a range of 420 nm or more and 480 nm or less, for efficiently exciting the fluorescent material. In the light emission spectrum of the light emitting element, the full width at half maximum of the light emission spectrum showing the maximum light emission intensity may be, for example, 30 nm or less. The light emitting element used may be, for example, a semiconductor light emitting element using a nitride-based semiconductor.

Method for Producing Light Emitting Device of First Configuration Example

The method for producing the light emitting device according to the first configuration example will be described. For the details, reference may also be made, for example, to the description of Japanese Unexamined Patent Publication No. 2010-062272 A. The method for producing the light emitting device preferably includes a step of preparing the molded article, a step of disposing the light emitting element, a step of disposing a composition for a wavelength converting member, and a step of forming a resin package. In the case where an assembled molded article having plural recessed portions is used as the molded article, the production method may include, after the step of forming a resin package, an individuating step of separating resin packages each having a unit region.

In the step of preparing the molded article, plural leads are integrally molded with a thermosetting resin or a thermoplastic resin, so as to prepare the molded article having a recessed portion having a side surface and a bottom surface. The molded article may be a molded article formed of an assembled substrate having plural recessed portions.

In the step of disposing the light emitting element, the light emitting element is disposed on the bottom surface of the recessed portion of the molded article, and the anode and the cathode of the light emitting element are connected to the first lead and the second lead, respectively, with wires.

In the step of disposing the composition for a wavelength converting member, the composition for a wavelength converting member is disposed in the recessed portion of the molded article. The composition for a wavelength converting member contains the fluorescent material composite particles as the first fluorescent material, and the second resin, and may contain the second fluorescent material.

In the step of forming a resin package, the composition for a wavelength converting member disposed in the recessed portion of the molded article is cured to form a resin package, and thus the light emitting device is produced. In the case where a molded article formed of an assembled substrate having plural recessed portions is used, the molded article is individuated into resin packages each having a unit region of the assembled substrate having plural recessed portions in the individuating step after the step of forming a resin package, and thus the light emitting devices each are produced. The light emitting device according to the first configuration example shown in FIG. 9 can be produced in the aforementioned manner.

Light Emitting Device of Second Configuration Example

Figure 10:
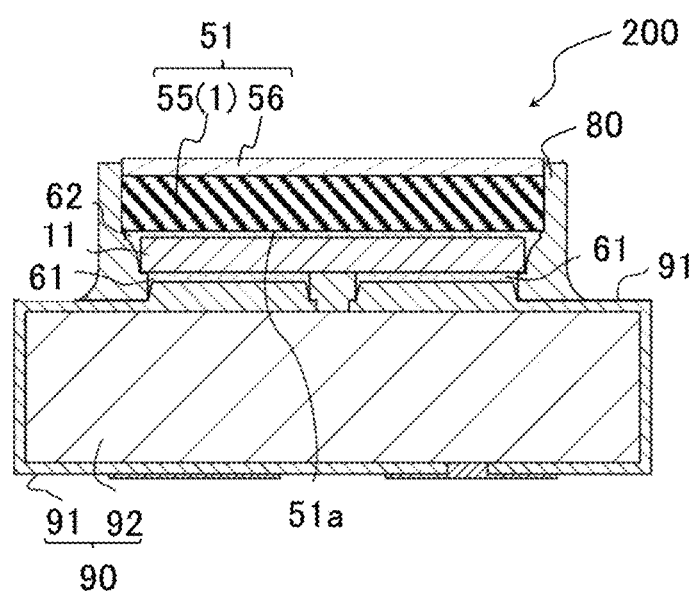
FIG. 10 is a schematic cross sectional view showing an exemplary light emitting device according to a second illustrative embodiment of the present disclosure.
Figure 11:
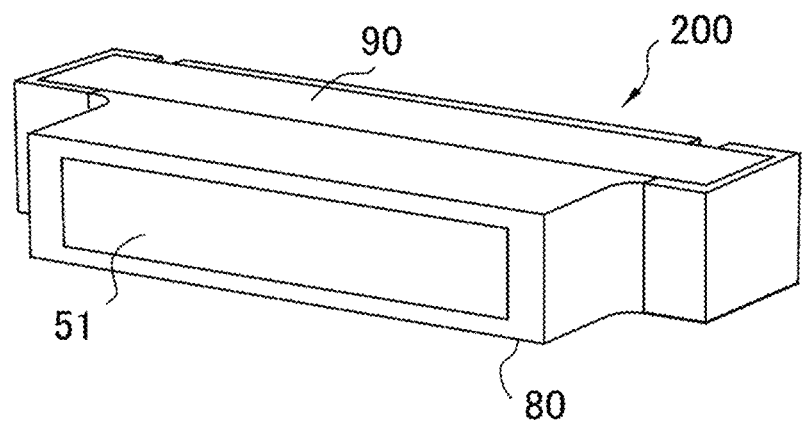
FIG. 11 is a schematic perspective view showing the exemplary light emitting device according to the second illustrative embodiment of the present disclosure.

FIG. 10 is a schematic cross sectional view showing the second illustrative embodiment of the light emitting device. FIG. 11 is a schematic perspective view showing the second illustrative embodiment of the light emitting device.

A light emitting device 200 includes a light emitting element 11 as an excitation light source and a wavelength converting member 51. The light emitting device 200 according to the second configuration example is a side emission type (which may also be referred to as a side view type). The light emitting device 200 according to the second configuration example can be used, for example, in an image display device. The wavelength converting member 51 includes a wavelength converting sheet 55 having the fluorescent material composite particles 1 as a fluorescent material and a second resin, and a translucent member 56 disposed on the emission side of the wavelength converting sheet 55. The wavelength converting member may be a wavelength converting member having another embodiment, as far as the wavelength converting sheet containing the fluorescent material composite particles 1 as the first fluorescent material and the second resin is included. The first light emitting element 11 is mounted in a flip chip manner on an interconnection 91 on a base board 90 via a conductive member 61. The base board 90 includes the interconnection 91 and a substrate 92 supporting the interconnection 91. The wavelength converting member 51 has a size that covers over the entire area of the light emitting element 11 on the front view. An incident surface 51a of the wavelength converting member 51 is adhered to one surface of the light emitting element 11 via a light guide member 62. A covering member 80 is formed on the base board 90 to cover the side surfaces of the conductive member 61, the light emitting element 11, the light guide member 62, and the wavelength converting member 51, and encompasses the entire circumference of the conductive member 61, the light emitting element 11, the light guide member 62, and the wavelength converting member 51. The front surface of the wavelength converting member 51 and the front surface of the covering member 80 constitute substantially the same plane. The light emitting element 11 used may be a light emitting element similar to the light emitting element 10.

Light Emitting Device of Third Configuration Example

Figure 12:
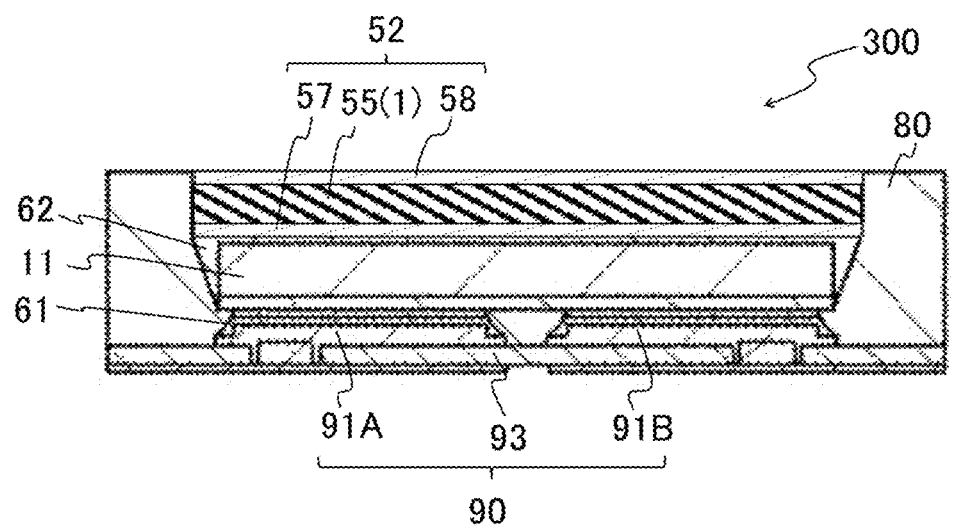
FIG. 12 is a schematic cross sectional view showing an exemplary light emitting device according to a third illustrative embodiment of the present disclosure.
Figure 13:
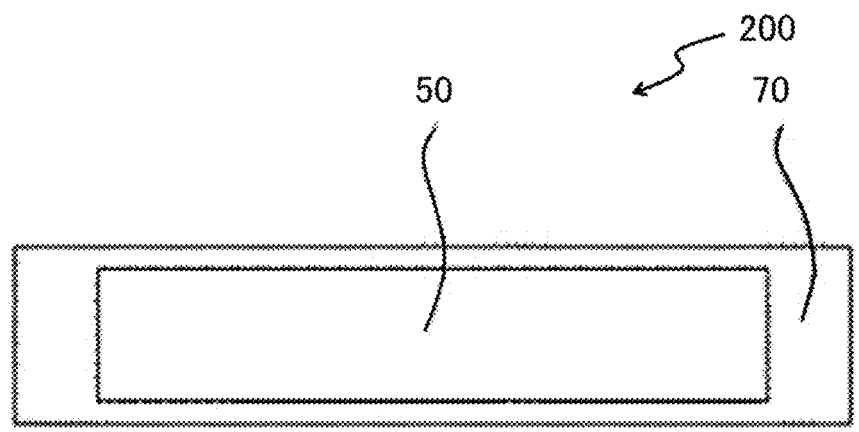
FIG. 13 is a schematic plan view showing the exemplary light emitting device according to the third illustrative embodiment of the present disclosure.

FIG. 12 is a schematic cross sectional view showing the third illustrative embodiment of the light emitting device. FIG. 13 is a schematic plan view showing the third illustrative embodiment of the light emitting device. A light emitting device 300 according to the third configuration example is a top emission type (which may also be referred to as a top view type). The light emitting device 300 according to the third configuration example can be used, for example, in an image display device. In the light emitting device 300, the members that are common to the light emitting device 200 according to the second configuration example are attached with the same symbols. The light emitting device 300 uses a base board 90 including a thin substrate 93 having a thickness, for example, of 500 μm or less and interconnections 91A and 91B. The wavelength converting member 52 includes a wavelength converting sheet 55 containing the fluorescent material composite particles 1 as a fluorescent material and a second resin, having on both surfaces of the incident surface and the emission surface of light, a first translucent member 57 in the form of sheet and a second translucent member 58 in the form of sheet. The wavelength converting member may be a wavelength converting member having another embodiment, as far as the wavelength converting sheet containing the fluorescent material composite particles 1 as the first fluorescent material and the second resin is included. The incident surface of light of the wavelength converting member 52 is bonded to one surface of the light emitting element 11 via a light guide member 62. The light emitting device 300 includes a base board 90 having a substrate 93, and the other members are common to the light emitting device 200.

Method for Producing Light Emitting Devices of Second Configuration Example and Third Configuration Example For the method for producing the light emitting devices according to the second configuration example and the third configuration example, reference may be made to the method described in JP 2017-188592 A. The method for producing the light emitting device according to the third configuration example may include a step of removing a part of the base board to thin the base board.

The light emitting device can be used, for example, as a backlight. The light emitting device can derive a wide range of light emission color by using a light emitting element emitting blue color, a green fluorescent material emitting green color, and a red fluorescent material emitting red color. The fluorescent material composite particles used as the first fluorescent material can be used as the fluorescent material emitting green light. The second fluorescent material can be used as the fluorescent material emitting red light.

In the light emitting device used as a backlight, for example, a wide range of light emission color can be derived by using a light emitting element emitting blue color, a green fluorescent material emitting green color, and a red fluorescent material emitting red color.

Image Display Device

An image display device using the light emitting device will be described.

Figure 14:
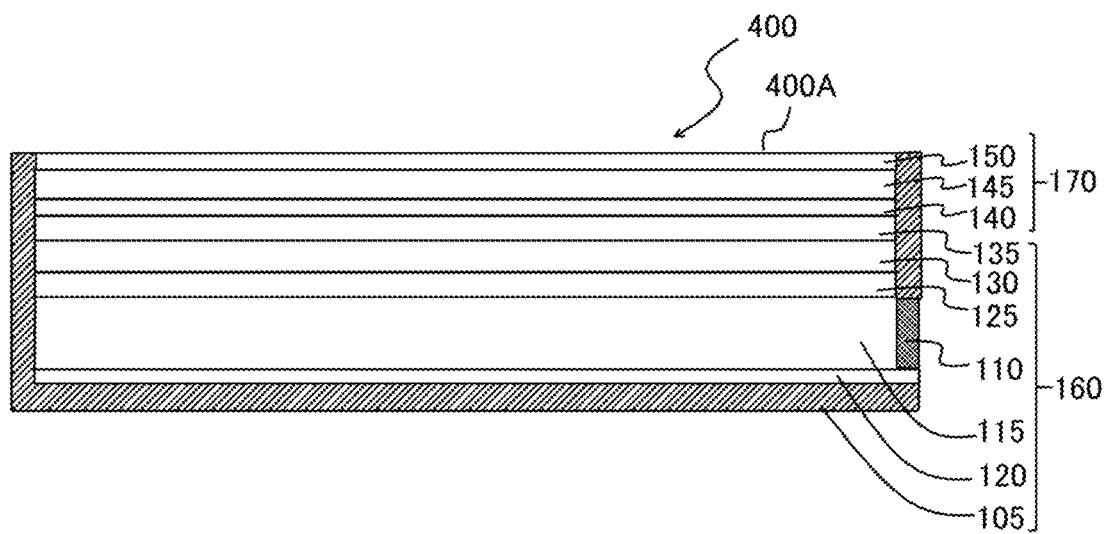
FIG. 14 is a schematic cross sectional view showing an exemplary edge light type backlight structure relating to an exemplary image display device.

FIG. 14 is a schematic cross sectional view showing one example of an image display device 400. The image display device 400 includes a backlight device 160 and a display panel 170 disposed on the light emission side of the backlight device 160. The image display device 400 has a display surface 400A displaying an image. In the figure, the surface of the display panel 170 constitutes the display surface 400A.

The backlight device 160 illuminate the back surface of the display panel 170 in a planar form.

Display Panel

The display panel 170 is a liquid crystal display panel, and includes a first polarizing sheet 140 disposed on the light incident side, a second polarizing sheet 150 disposed on the light emission side, and a liquid crystal cell 145 disposed between the first polarizing sheet 140 and the second polarizing sheet 150.

For the details of the liquid crystal display panel, reference may be made to various known literatures (for example, "Flat Panel Display Daijiten" (Comprehensive Dictionary of Flat Panel Displays), supervised by Tatsuo UCHIDA and Heiju UCHIIKE, Kogyo Chosakai Publishing Co., Ltd. (2001)), and the more detailed description is omitted herein.

Backlight Device

The backlight device 160 is constituted as an edge light type backlight device, and includes a chassis 105, a light emitting device 110 disposed on the chassis 105 or at a position remote from the chassis 105, a light guide plate 115 disposed on the side of the light emitting device 110, a diffusion sheet 125 disposed on the light emission side of the light guide plate 115, a second wavelength converting member 130 in the form of sheet disposed on the diffusion sheet 125, and a prism sheet 135 disposed on the light emission surface side of the second wavelength converting member 130 in the form of sheet. A reflection sheet 120 is disposed between the chassis 105 and the light guide plate 115.

The backlight device 160 includes a light emission surface emitting light in a planar form. In the figure, the light emission surface of the prism sheet 135 constitutes the light emission surface of the backlight device 160.

The surface of the second wavelength converting member 130 in the form of sheet on the side of the diffusion sheet 125 constitutes the light incident surface, and the surface of the second wavelength converting member 130 in the form of sheet on the side of the prism sheet 135 constitutes the light emission surface. The second wavelength converting member 130 in the form of sheet used may be a wavelength converting member similar to the wavelength converting members according to the first illustrative embodiment and the second illustrative embodiment, and may also be another wavelength converting member.

The light emitting device 110 is constituted by a large number of light emitting elements disposed and arranged in a linear form along one side edge of the light guide plate 115 on the light incident surface of the light guide plate 115. The light emitting device 110 used may be the aforementioned light emitting device. A light emitting device having no wavelength converting member may further be provided.

Figure 15:
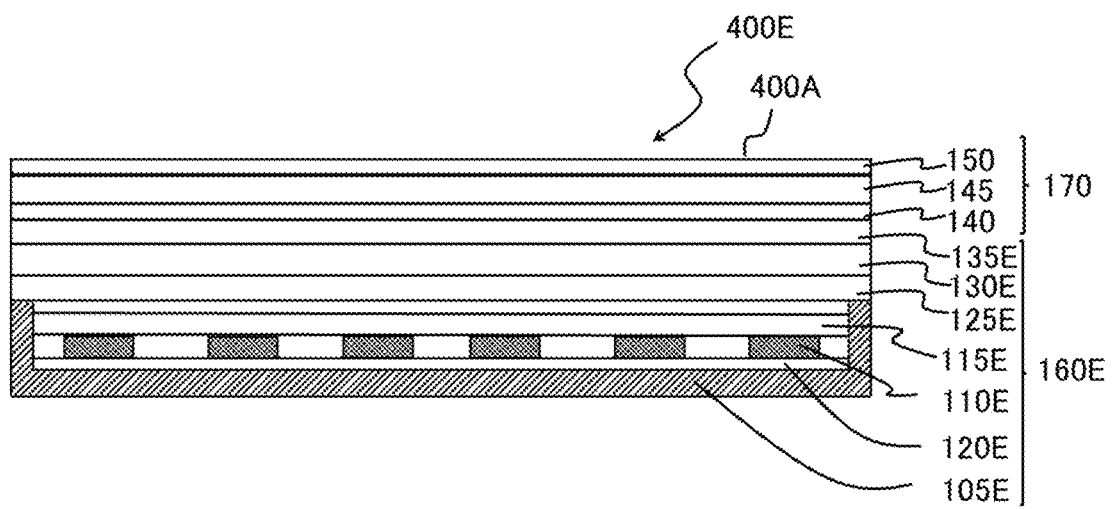
FIG. 15 is a schematic cross sectional view showing an exemplary direct type backlight structure relating to another exemplary image display device.

Another example of the image display device will be described with reference to the drawing. FIG. 15 is a schematic cross sectional view showing an image display device having a direct type backlight structure.

An image display device 400E includes a backlight device 160E and a display panel 170 disposed on the light emission side of the backlight device 160E, having a structure similar to the display panel 170 described for the aforementioned image display device.

The backlight device 160E is constituted as a direct type backlight device, and includes a light emitting device 110E, a chassis 105E having the light emitting device 110E disposed therein, a diffusion sheet 125E disposed at a position remote from the light emitting device 110E, a second wavelength converting member 130E in the form of sheet disposed on the diffusion sheet 125E, and a prism sheet 135E disposed on the light emission side of the second wavelength converting member 130E in the form of sheet. The light emitting device 110E used may be the aforementioned light emitting device. A reflection sheet 120E is disposed between the chassis 105E and the light guide plate 115E.

Reflection Sheet

The reflection sheet reflects light emitted from the light emitting device 110E toward the back side, and makes the light to be incident on the light guide plate 115E, the diffusion sheet 125E, and the like, and thereby the light escaping to the back side can be efficiently used.

The light emitted from the backlight device 160E is made to be incident on the first polarizing sheet 140 provided in the display panel 170 and emitted from the display surface 400A of the display device in this manner.

EXAMPLES

The present disclosure will be described specifically with reference to examples. The present disclosure is not limited to the examples.

The reagents and the like used in Examples and Comparative Example were as follows.

Formamidine hydrobromide (FABr) (manufactured by Tokyo Kasei Kogyo Co., Ltd.)

Lead(II) bromide ($PbBr_2$) (manufactured by Strem Chemicals, Inc.)

Octadecyldimethyl (3-sulfopropyl)ammonium hydroxide (SBE-18) (manufactured by Merck KGaA)

Oleylamine (manufactured by Tokyo Kasei Kogyo Co., Ltd.)

Hexane (manufactured by Fujifilm Wako Pure Chemical Corporation)

Toluene (manufactured by Fujifilm Wako Pure Chemical Corporation)

Tricyclodecanedimethanol diacrylate (A-DCP, manufactured by Shin-Nakamura Chemical Co., Ltd.)

Dicyclopentanyl acrylate (FA-513AS, manufactured by Showa Denko Materials Co., Ltd.)

EO-modified bisphenol A dimethacrylate (FA-320M, manufactured by Showa Denko Materials Co., Ltd.)

EO-modified bisphenol A dimethacrylate (FA-321M, manufactured by Showa Denko Materials Co., Ltd.)

Silica particles (average particle diameter by laser diffraction scattering method: 110 nm (catalog value), product name: QSG-100, manufactured by Shin-Etsu Chemical Co., Ltd.)

Dimethyl silicone oil (KF-96-3000cs, manufactured by Shin-Etsu Chemical Co., Ltd.)

Diphenyl(2,4,6-trimethylbenzoyl)phosphine oxide (TPO, manufactured by Fujifilm Wako Pure Chemical Corporation)

Zirconia ball YTZ having diameter of 10 mm ($\varphi$ 10 mm) (yttria-stabilized zirconia) (manufactured by As One Corporation)

Zirconia ball YTZ having diameter of 4 mm ($\varphi$ 4 mm) (yttria-stabilized zirconia) (manufactured by As One Corporation)

Zirconia ball YTZ having diameter of 2 mm ($\varphi$ 2 mm) (yttria-stabilized zirconia) (manufactured by As One Corporation)

Zirconia ball YTZ having diameter of 0.2 mm ($\varphi$ 0.2 mm) (yttria-stabilized zirconia) (manufactured by As One Corporation)

The equipments used for the production of the fluorescent nanoparticles and the fluorescent material composite particles were as follows.

Ball mill rotating stand (AV-1, manufactured by As One Corporation)

Wet type fine bead mill pulverizer/disperser (Labostar Mini, manufactured by Ashizawa Finetech Ltd.)

Evaporator (R-205, manufactured by Buchi Inc.)

Planetary centrifugal mixer (AR-250, manufactured by Thinky Corporation)

UV irradiator (SUV-008, manufactured by Sen Lights Corporation)

Centrifugal separator (CN-2060, turning radius: 94 mm, manufactured by As One Corporation)

Fluorescent Nanoparticle Precursor

The following raw materials were placed in an alumina pot.

Formamidine hydrobromide (FABr): 25.200 g

Lead(II) bromide ($PbBr_2$): 74.2 g

Zirconia ball YTZ having diameter of 10 mm: 22.600 g

Zirconia ball YTZ having diameter of 2 mm: 5.6 g

The alumina pot having the raw materials placed therein was mounted on the ball mill rotating stand, and the raw materials were mixed at a rotation number of 160 rpm for 48 hours.

50 g of hexane as an organic solvent was added to the alumina pot having the raw materials, and the raw materials were further mixed at a rotation number of 160 rpm for 3 hours.

After completing the mixing of the raw materials, the resulting mixture was passed through a nylon mesh having an aperture of 300 μm by suction filtration to remove the zirconia balls YTZ, resulting in a first mixture in the form of slurry. The first mixture after the suction filtration was spontaneously dried in an air atmosphere for 24 hours, so as to provide a fluorescent nanoparticle precursor. The fluorescent nanoparticle precursor had a composition represented by $[(NH_2)_2CH]PbBr_3$ (which may be hereinafter referred to as "$FAPbBr_3$"). The fluorescent nanoparticle precursor displayed orange color. The fluorescent nanoparticle precursor did not emit light even under irradiation of light from the excitation light source.

Measurement of X-Ray Diffraction Pattern

Figure 16:
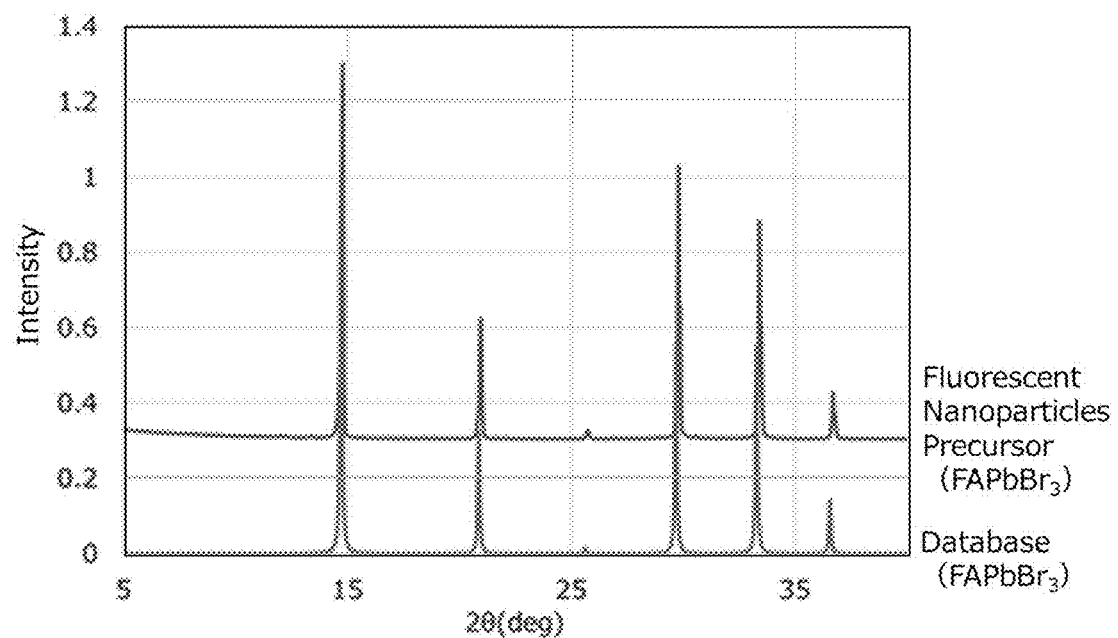
FIG. 16 is an exemplary XRD pattern of a fluorescent nanoparticle precursor having a composition represented by $FAPbBr_3$ and an exemplary XRD pattern of $FAPbBr_3$ registered in ICSD.

The X-ray diffraction (XRD) pattern of the fluorescent nanoparticle precursor was measured by the X-ray diffraction (XRD) method using the CuKα line. The XRD pattern showing the diffraction intensity with respect to the diffraction angle (2θ) was measured with an X-ray diffractometer (MiniFlex, manufactured by Rigaku Corporation). FIG. 16 is the XRD pattern of the fluorescent nanoparticle precursor having a composition represented by $FAPbBr_3$ and the XRD pattern of $FAPbBr_3$ having an orthorhombic crystal structure registered in ICSD (inorganic crystal structure database).

As shown in FIG. 16, the peak positions of the XRD pattern of the fluorescent nanoparticle precursor agreed with the peak positions of the XRD pattern of $FAPbBr_3$ registered in ICSD. It was confirmed from the results of the XRD patterns that the fluorescent nanoparticle precursor had an orthorhombic crystal structure.

Fluorescent Nanoparticles 4.40 g of the fluorescent nanoparticle precursor, 1.30 g of oleylamine, 0.40 g of octadecyldimethyl (3-sulfopropyl) ammonium hydroxide (SBE-18), and 432.00 g of toluene, as organic solvents, and 442.00 g of zirconia ball YTZ having diameter of 0.2 mm as a dispersion medium were placed in the wet type fine bead mill pulverizer/disperser, and agitated at a circumferential speed of 14 m/sec and a rotation number of 4,456 rpm for 1 hour.

The mixture obtained through the agitation was passed through a nylon mesh having an aperture of 25 μm by suction filtration to remove the zirconia balls YTZ and the unpulverized coarse fluorescent nanoparticle precursor, resulting in a second mixture in the form of slurry The second mixture was placed in a vessel and subjected to centrifugal separation at 5,000 rpm for 10 minutes with the aforementioned centrifugal separator to settle coarse particles, and the supernatant was recovered. The resulting supernatant was passed through a syringe filter having a pore diameter of 0.2 μm to provide a solution containing the fluorescent nanoparticles. The content of the fluorescent nanoparticles in the solution was 1.0% by mass. In irradiating the solution containing the fluorescent nanoparticles with light, the solution containing the fluorescent nanoparticles emitted light.

Light Emission Characteristics

The solution containing the fluorescent nanoparticles (content of fluorescent nanoparticles: 1.0% by mass) was measured for the light emission characteristics. By using a quantum efficiency measurement system (QE-2100, manufactured by Otsuka Electronics Co., Ltd.), the solution containing the fluorescent nanoparticles was irradiated with excitation light having a light emission peak wavelength of 450 nm, the solution containing the fluorescent nanoparticles was diluted with a solvent (toluene) to make an absorbance at 450 nm of 0.15, and the light emission spectrum was measured at room temperature (25° C.). The internal quantum efficiency (%), the light emission peak wavelength (nm), and the full width at half maximum of the light emission spectrum having the light emission peak wavelength (nm) were obtained from the resulting light emission spectrum. The internal quantum efficiency (%) was the proportion of photons converted to light emission in photons absorbed by the fluorescent nanoparticles, and was calculated by dividing the number of photons involved in light emission (%) by the number of absorbed photons (%). The light emission characteristics of the fluorescent nanoparticles are shown in Table 1.

Figure 17:
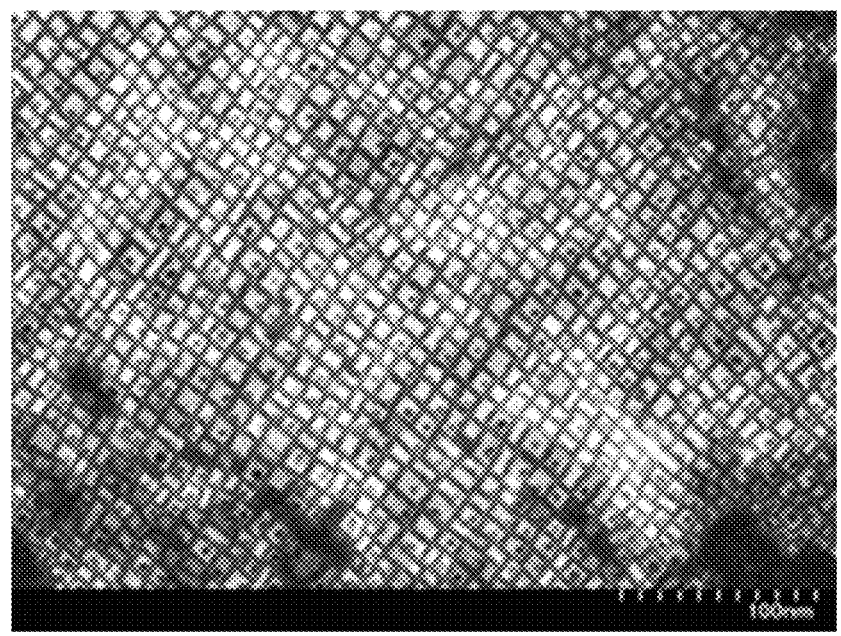
FIG. 17 is an exemplary TEM micrograph of fluorescent nanoparticles in a solution.

The fluorescent nanoparticles in the solution were observed with a transmission electron microscope (TEM) (H-7650, manufactured by Hitachi Hightechnologies Corporation). FIG. 17 is the TEM image of the fluorescent nanoparticles in the solution.

Average Particle Diameter of Fluorescent Nanoparticles

The average particle diameter of the fluorescent nanoparticles was measured from TEM images at a magnification of 80,000 to 200,000 of the average particle diameter of the fluorescent nanoparticles in the solution. The TEM grid used was High Resolution Carbon Substrate, trade name, HRC-C10 STEM Cu 100P Grid (manufactured by Okenshoji Co., Ltd.). The shape of the particles thus obtained was a spherical shape or a polygonal shape. TEM images were selected at three or more positions, all the measurable fluorescent nanoparticles included in the TEM images were measured for the particle diameters, and the arithmetic average was designated as the average particle diameter. The average particle diameter of the fluorescent nanoparticles is the longest one of line segments that each connect arbitrary two points on the outer circumference of the particle observed on the TEM image and pass through the center of the particle. The particle having an image that is cut by the edge of the TEM image was excluded from the measurement of the particle diameter. Specifically, 100 or more in total of the fluorescent nanoparticles on the TEM images of three or more positions were measured for the particle diameters. The average particle diameter is shown in Table 1.

TABLE 1

| | Internal quantum efficiency (%) | Light emission peak wavelength (nm) | Full width at half maximum (nm) | Average particle diameter (nm) |
|---|---|---|---|---|
| Fluorescent nanoparticles | 76 | 517 | 50 | 10 |

The fluorescent nanoparticles had high light emission characteristics with an internal quantum efficiency of 76% and a narrow full width at half maximum of 50 nm, and were excellent in chromatic purity. The fluorescent nanoparticles had a light emission spectrum having a light emission peak wavelength of 517 nm, and emitted green light through absorption of excitation light having a light emission peak wavelength of 450 nm.

Fluorescent Material Composite Particles of Example 1
Preparation of First Dispersion Liquid 12.000 g of the solution containing the fluorescent nanoparticles (content of the fluorescent nanoparticles: 1.0% by mass) and 5.880 g of tricyclodecanedimethanol diacrylate (A-DCP) as the radically polymerizable monomer were mixed to prepare a solution. The solution was depressurized to 20 mbar with an evaporator, and toluene was evaporated by heating to 70° C. over 15 minutes, so as to provide an A-DCP dispersion liquid containing the fluorescent nanoparticles. The A-DCP dispersion liquid containing the fluorescent nanoparticles (5.000 g) and 0.050 g of diphenyl(2,4,6-trimethylbenzoyl)phosphine oxide (TPO) as the photopolymerization initiator were mixed at room temperature (25° C.) for 5 hours to provide the first dispersion liquid to be a dispersed phase.

Preparation of Second Dispersion Liquid 0.120 g of silica particles (QSG-100) having a volume average particle diameter of 110 nm as the translucent inorganic particles and 16.230 g of a dimethyl silicone oil (KF-96-3000cs) as the organic solvent were agitated with a planetary centrifugal mixer for 3 minutes and deaerated for 1 minute to provide a second dispersion liquid containing the dimethyl silicone oil having the silica particles dispersed therein.

Suspension Polymerization

The first dispersion liquid (2,000 g) containing the fluorescent nanoparticles, the radically polymerizable monomer, and the photopolymerization initiator, and the second dispersion liquid (16,350 g) containing the translucent inorganic particles and the organic solvent were agitated with a planetary centrifugal mixer for 3 minutes, so as to form an emulsion containing the first dispersion liquid as the dispersed phase and the second dispersion liquid as the continuous phase.

The emulsion was placed in a Petri dish to a thickness of 1 mm.

The emulsion was irradiated with an ultraviolet ray from an UV irradiator to start polymerization reaction of the radically polymerizable monomer, and thereby the radically polymerizable monomer was cured through polymerization reaction in the state where the translucent inorganic particles were adsorbed through a pickering emulsion to the oil/oil interface between the continuous phase and the liquid droplets of the radically polymerizable monomer as the dispersed phase, so as to provide the fluorescent material composite particles including particles of the first resin including the fluorescent nanoparticles, and the translucent inorganic particles embedded by at least a part of each the translucent inorganic particles in the first resin and unevenly distributed to the surface of the particles.

Washing and Drying

The resulting fluorescent material composite particles were washed with 35 mL of hexane added thereto. After washing, the fluorescent material composite particles were settled through centrifugal separation at 5,000 rpm for 5 minutes with a centrifugal separator, and the supernatant was removed by solid-liquid separation to provide a precipitate.

The resulting precipitate was subjected thrice to the washing with hexane and the solid-liquid separation with the centrifugal separator in this order, and the resulting precipitate was washed by agitating in 50 mL of hexane for 2 hours.

After the agitation, the fluorescent material composite particles were settled through centrifugal separation at 5,000 rpm for 5 minutes with a centrifugal separator, and the supernatant was removed by solid-liquid separation to provide a precipitate. The precipitate was spontaneously dried in an air atmosphere for 15 hours, so as to provide the fluorescent material composite particles of Example 1.

Fluorescent Material Composite Particles of Example 2

The fluorescent material composite particles of Example 2 were obtained in the same manner as in Example 1 except that tricyclodecanedimethanol diacrylate (A-DCP) and EO-modified bisphenol A dimethacrylate (FA-320M) were used at a mass ratio of 70/30 as the radically polymerizable monomer.

Fluorescent Material Composite Particles of Example 3

The fluorescent material composite particles of Example 3 were obtained in the same manner as in Example 1 except that tricyclodecanedimethanol diacrylate (A-DCP) and EO-modified bisphenol A dimethacrylate (FA-321M) were used at a mass ratio of 70/30 as the radically polymerizable monomer.

Light Emission Characteristics of Fluorescent Material Composite Particles

The fluorescent material composite particles of Examples were measured for the internal quantum efficiency (%), the light emission peak wavelength (nm), and the full width at half maximum of the light emission spectrum having the light emission peak wavelength (nm) in the same manner as in the measurement of the fluorescent nanoparticles. The light emission characteristics of the fluorescent material composite particles are shown in Table 2.

Volume Average Particle Diameter of Fluorescent Material Composite Particles

The fluorescent material composite particles of Examples were measured for the cumulative value of 50% from the small diameter side in the volume based particle size distribution (i.e., the median diameter) as the average particle diameter with a laser diffraction particle size distribution analyzer (Master Sizer 2000, manufactured by Malvern Panalytical Ltd.). The results are shown in Table 2.

SEM Images: Reflected Electron Image

Figure 18:
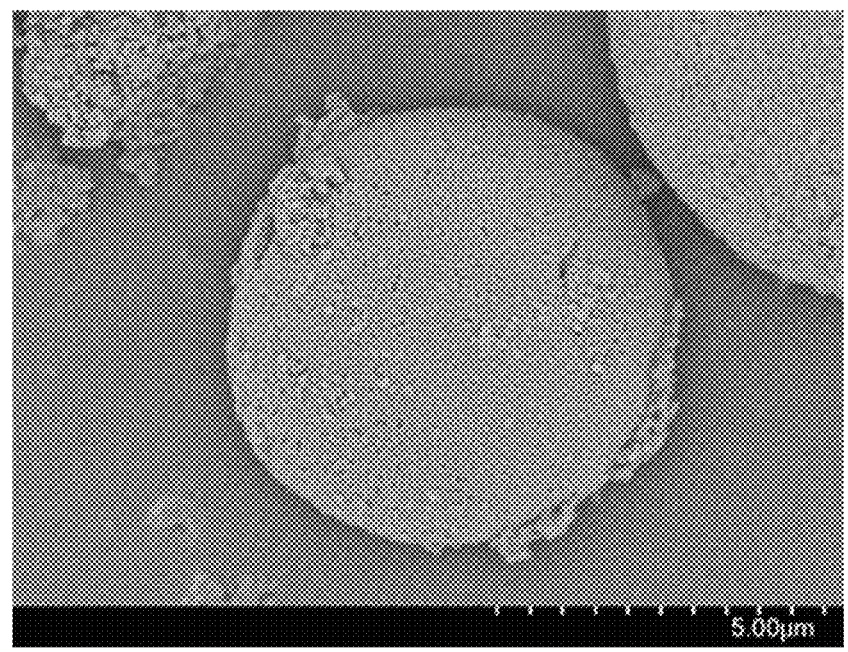
FIG. 18 is an exemplary SEM micrograph (reflected electron image) of the fluorescent material composite particles in Example 1.
Figure 19:
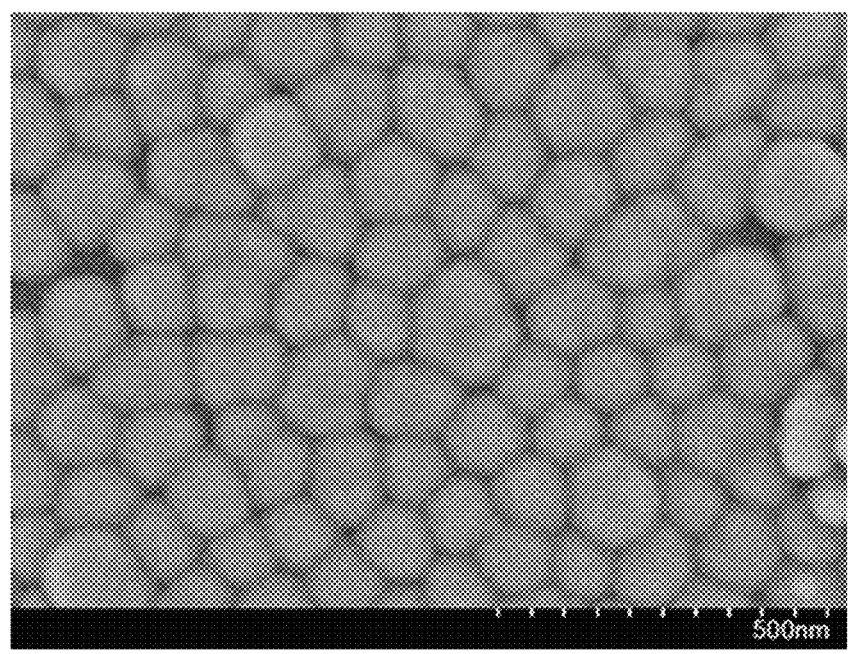
FIG. 19 is an exemplary partial enlarged view of the SEM micrograph (reflected electron image) of the fluorescent material composite particles in Example 1.

An SEM image as a reflected electron image of the fluorescent material composite particles was obtained with a scanning electron microscope (FE-SEM, SU3500, manufactured by Hitachi Hightechnologies Corporation). FIG. 18 is the SEM image (reflected electron image) of the fluorescent material composite particles in Example 1. FIG. 19 is the partial enlarged view of the SEM image (reflected electron image) in FIG. 18.

SEM Images: Reflected Electron Image

Figure 20:
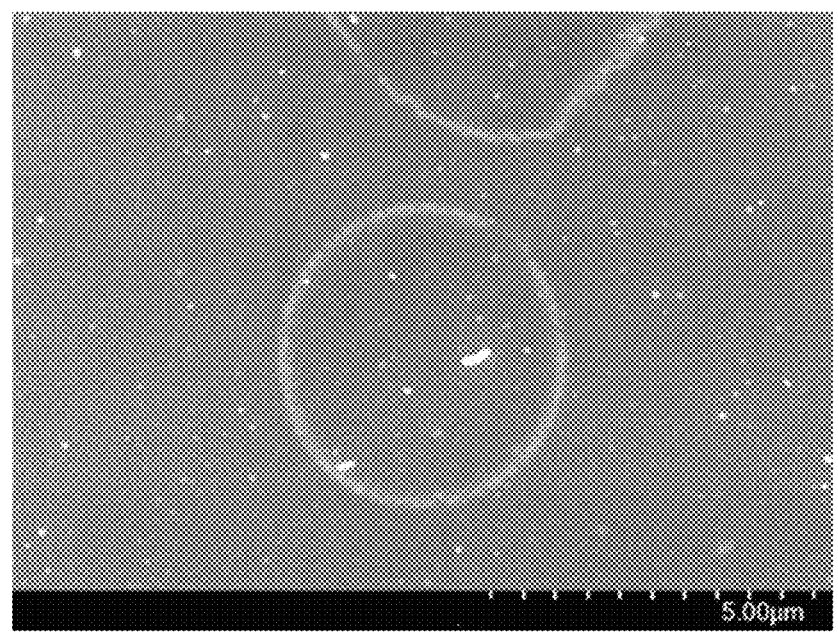
FIG. 20 is an exemplary SEM micrograph (reflected electron image) of a cross section of the fluorescent material composite particles in Example 1.
Figure 21:
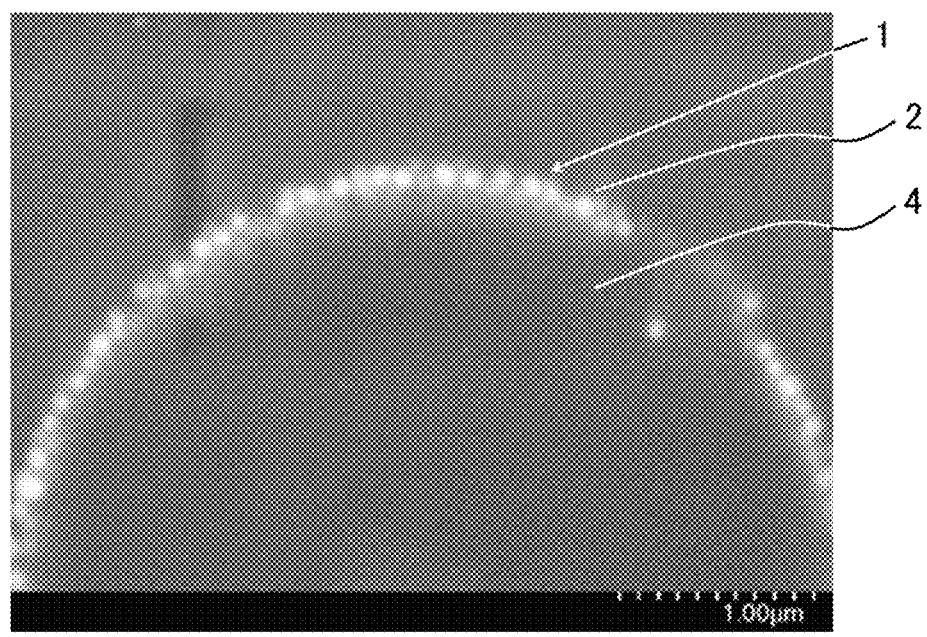
FIG. 21 is an exemplary partial enlarged view of the SEM micrograph (reflected electron image) of the cross section of the fluorescent material composite particles in Example 1.

The fluorescent material composite particles of Example 1 were embedded in an epoxy resin, and after curing the resin, the resin was cut to expose the cross sectional surfaces of the fluorescent material composite particles. The cut surface was polished with sandpaper, and then finished with a cross section polisher (CP), from which an SEM image as a reflected electron image of the cross section of the fluorescent material composite particles of Example 1 was obtained field-emission with a scanning electron microscope (FE-SEM, SU8230, manufactured by Hitachi Hightechnologies Corporation). FIG. 20 is the SEM image (reflected electron image) of the cross section of the fluorescent material composite particles in Example 1. FIG. 21 is the partial enlarged view of the SEM image (reflected electron image) in FIG. 20.

TABLE 2

|  | Internal quantum efficiency (%) | Light emission peak wavelength (nm) | Full width at half maximum (nm) | Volume average particle diameter (nm) |
| --- | --- | --- | --- | --- |
| Example 1 | 62 | 525 | 31 | 11.5 |
| Example 2 | 66 | 525 | 31 | 10.4 |
| Example 3 | 66 | 526 | 31 | 11.4 |

The fluorescent material composite particles of Examples 1 to 3 had high light emission characteristics with an internal quantum efficiency of 62% or 66%. The fluorescent material composite particles of Examples 1 to 3 had a narrow full width at half maximum of 31 nm, and were excellent in chromatic purity. The fluorescent material composite particles of Examples 1 to 3 had a light emission spectrum of the fluorescent material composite particles having a light emission peak wavelength of 525 nm or 526 nm, and emitted green light through absorption of excitation light having a light emission peak wavelength of 450 nm. The fluorescent material composite particles of Examples 1 to 3 had a volume average particle diameter in a range of 0.5 μm or more and 50 μm or less.

FIGS. 18 and 19 are the SEM micrographs (reflected electron images) of the fluorescent material composite particles of Example 1. It was confirmed that the fluorescent material composite particles included the translucent inorganic particles embedded on the surface with substantially no gap.

FIGS. 20 and 21 are the SEM micrographs (reflected electron images) of the cross section of the fluorescent material composite particles of Example 1. It was confirmed that the fluorescent material composite particles 1 included the translucent inorganic particles 2 that were embedded by at least a part of each the translucent inorganic particles 2 in the first resin 4 and unevenly distributed to the surface of the particles.

Wavelength Converting Member of Example 1

0.3 g of the fluorescent material composite particles of Example 1, 0.693 g of dicyclopentanyl acrylate (FA-513AS) and 0.297 g of EO-modified bisphenol A dimethacrylate (FA-321M) as the resin, and 0.010 g of diphenyl(2,4,6-trimethylbenzoyl)phosphine oxide (TPO) as the photopolymerization initiator were mixed to prepare a composition for a wavelength converting sheet.

A first translucent member including a gas barrier layer formed of silicon dioxide and a layer formed of polyethylene terephthalate was prepared. The thickness of the first translucent member was 120 μm.

On the surface of the first translucent member close to the gas barrier layer, 0.140 g of the composition for a wavelength converting sheet was coated by the printing method with a squeegee. A second translucent member similar to the first translucent member was disposed with the gas barrier layer side thereof directed to the side of the composition for a wavelength converting sheet, so as to hold the composition for a wavelength converting sheet between the first translucent member and the second translucent member, and the assembly was irradiated with an ultraviolet ray from the UV irradiator to initiate the polymerization reaction of the resin for curing. The wavelength converting sheet having a thickness of 80 μm was held between and bonded to the first translucent member and the second translucent member, so as to produce a wavelength converting member of Example 1. The concentration of the fluorescent nanoparticles in the wavelength converting member was 0.6% by mass based on the total amount of the composition for a wavelength converting sheet. The wavelength converting member of Example 1 had the gas barrier layers between the first translucent member and the wavelength converting sheet and between the second translucent member and the wavelength converting sheet.

Wavelength Converting Member of Example 2

A wavelength converting member of Example 2 was produced in the same manner as in the production of the wavelength converting member of Example 1 except that the fluorescent material composite particles of Example 2 were used.

Wavelength Converting Member of Example 3

A wavelength converting member of Example 3 was produced in the same manner as in the production of the wavelength converting member of Example 1 except that the fluorescent material composite particles of Example 3 were used.

Wavelength Converting Member of Comparative Example 1

12.000 g of the solution containing the fluorescent nanoparticles (content of the fluorescent nanoparticles: 1.0% by mass) and 5.880 g of dicyclopentanyl acrylate (FA-513AS) as the resin were mixed to prepare a solution. The solution was depressurized to 20 mbar with an evaporator, and toluene was evaporated by heating to 70° C. over 15 minutes, so as to provide an FA-513AS dispersion liquid containing the fluorescent nanoparticles. The FA-513AS dispersion liquid containing the fluorescent nanoparticles (0.300 g) was mixed with 0.399 g of FA-513AS and 0.297 g of EO-modified bisphenol A dimethacrylate (FA-321M) as the resin, and 0.010 g of diphenyl(2,4,6-trimethylbenzoyl) phosphine oxide (TPO) as the photopolymerization initiator, so as to prepare a composition for a wavelength converting sheet. A wavelength converting member of Comparative Example 1 was produced in the same manner as for the wavelength converting member of Example 1 except that the aforementioned composition for a wavelength converting sheet was used. The concentration of the fluorescent nanoparticles in the wavelength converting member was 0.6% by mass based on the total amount of the composition for a wavelength converting sheet.

Light Emission Intensity Retention Rate (%)

The wavelength converting members of Examples and Comparative Example were evaluated in the following manner.

The wavelength converting members of Examples and Comparative Example each were allowed to stand in a thermo-hygrostat chamber (manufactured by Espec Corporation) with an atmosphere having a temperature of 60° C. and a relative humidity of 90%. The wavelength converting members each were measured for the light emission intensity after elapsing periods of time of 1 hour, 3 hours, 8 hours, 24 hours, and 48 hours. The light emission intensity of the wavelength converting member was measured in the following manner. The wavelength converting member was disposed on a backlight source having a light emission peak wavelength of 450 nm, on which a prism sheet and a polarizing sheet were superimposed, and the light emission spectrum was measured at room temperature (25° C.) with a spectrophotometer. The maximum light emission intensity was designated as the light emission intensity of the wavelength converting member after elapsing the period of time. Assuming that the light emission intensity of the wavelength converting member before placing in the thermo-hygrostat chamber was the light emission intensity at 0 hour, and the light emission intensity at 0 hour 100%, the proportion of the light emission intensity of the wavelength converting member after elapsing each of the periods of time in the thermo-hygrostat chamber was obtained as the light emission intensity retention rate (%). The results are shown in FIG. 22.

Figure 22:
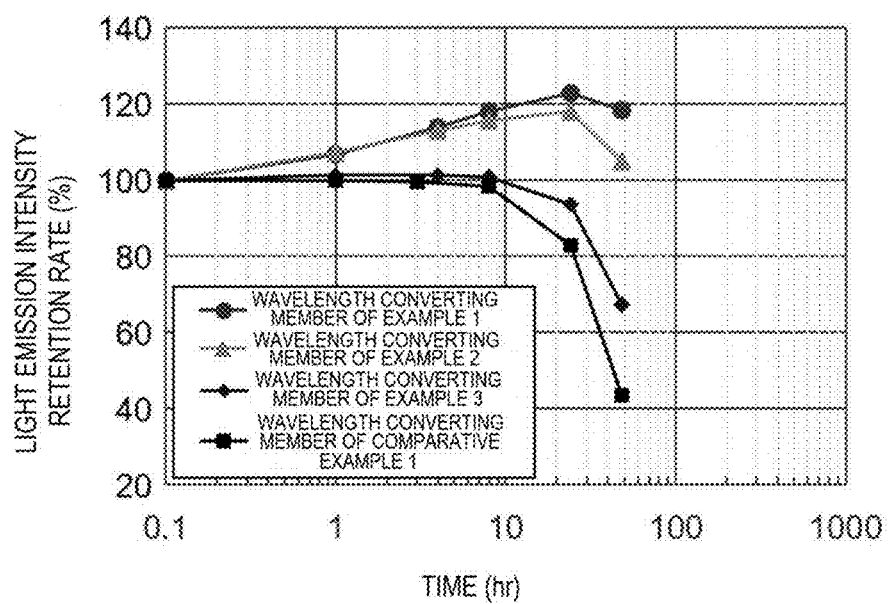
FIG. 22 is an exemplary graph showing an exemplary relationship between the time and the light emission intensity retention rate (%) of the wavelength converting members in Examples 1 to 3 and the wavelength converting member in Comparative Example 1.

FIG. 22 is a graph showing the relationship between the time and the light emission intensity retention rate (%) of the wavelength converting members of Examples 1 to 3 and Comparative Example 1.

The wavelength converting member of Example 1 had a light emission intensity retention rate of 100% or more even after elapsing 24 hours in the thermo-hygrostat chamber. It was confirmed from the result that the wavelength converting member using the fluorescent material composite particles of Example 1 retained the high light emission intensity of the fluorescent nanoparticles.

The wavelength converting member of Example 2 had a light emission intensity retention rate of 100% or more even after elapsing 24 hours in the thermo-hygrostat chamber. It was confirmed from the result that the wavelength converting member using the fluorescent material composite particles of Example 2 retained the high light emission intensity of the fluorescent nanoparticles.

The wavelength converting member of Example 3 had a light emission intensity retention rate of 90% or more even after elapsing 24 hours in the thermo-hygrostat chamber. It was confirmed from the result that the wavelength converting member using the fluorescent material composite particles of Example 3 retained the high light emission intensity of the fluorescent nanoparticles.

On the other hand, the wavelength converting member of Comparative Example 1 had a light emission intensity retention rate of less than 80% after elapsing 24 hours or more, and failed to retain the high light emission intensity of the fluorescent nanoparticles.

The fluorescent material composite particles, the wavelength converting member, and the light emitting device according to the illustrative embodiments described herein are useful as various illumination light sources, automotive light sources, display light sources, and the like, and can be applied particularly advantageously to a backlight unit of an image display device using liquid crystal. The light emitting device according to the illustrative embodiments described herein is advantageous for a backlight for a display device of a mobile equipment, and can be used as a light emitting device for general illuminations and a light emitting device for vehicles.

The invention claimed is:

1. Fluorescent material composite particles comprising translucent inorganic particles having a volume average particle diameter in a range of 30 nm or more and 500 nm or less, fluorescent nanoparticles having an average particle diameter in a range of 5 nm or more and 25 nm or less, and a first resin,
    at least a part of each of the translucent inorganic particles being embedded in the first resin,
    the translucent inorganic particles being unevenly distributed to a surface of the fluorescent material composite particles,
    the fluorescent material composite particles having a volume average particle diameter in a range of 0.5 μm or more and 50 μm or less,
    wherein the fluorescent nanoparticles contain a compound having a composition represented by the following formula (1):

wherein $M^1$ represents at least one kind of element selected from the group consisting of Cs, Rb, K, Na, and Li; $A^1$ represents at least one kind of cation selected from the group consisting of an ammonium ion, a formamidinium ion, a guanidinium ion, an imidazolium ion, a pyridinium ion, a pyrrolidinium ion, and a protonated thiourea ion; $M^2$ represents at least one kind of element selected from the group consisting of Ge, Sn, Pb, Sb, and Bi; X represents at least one selected from the group consisting of a chloride, a bromide, an iodide, a cyanide, a thiocyanate, an isothiocyanate, and a sulfide; a represents an integer in a range of 1 to 4; b represents an integer in a range of 1 to 2; c represents an integer in a range of 3 to 9; d represents a number in a range of 0 to 1; and e represents a number in a range of 0 to 1, provided that d+e is 1.

2. The fluorescent material composite particles according to claim 1, wherein the first resin contains a polymer obtained through polymerization of a radically polymerizable monomer.

3. The fluorescent material composite particles according to claim 2, wherein the radically polymerizable monomer is at least one kind of a monomer selected from the group consisting of an acrylate, a methacrylate, styrene, butadiene, isoprene, maleic anhydride, a maleic acid derivative, and a fumaric acid derivative.

4. The fluorescent material composite particles according to claim 1, wherein the translucent inorganic particles comprises at least one selected from the group consisting of silicon dioxide, aluminum oxide, zirconium oxide, titanium oxide, and magnesium fluoride.

5. The fluorescent material composite particles according to claim 1, wherein the fluorescent nanoparticles contain a compound having a chalcopyrite crystal structure.

6. A wavelength converting member comprising the fluorescent material composite particles according to claim 1 and a second resin.

7. The wavelength converting member according to claim 6, wherein the wavelength converting member is in a form of sheet.

8. The wavelength converting member according to claim 6, wherein the wavelength converting member further comprises at least one kind of fluoride fluorescent material selected from the group consisting of a fluoride fluorescent material having a composition represented by the following formula (2a) and a fluoride fluorescent material having a composition represented by the following formula (2b):

wherein $A^2$ contains at least one kind selected from the group consisting of $K^+$, $L^+$, $Na^+$, $Rb^+$, $Cs^+$, and $NH_4^+$; $M^3$ contains at least one element selected from the group consisting of Group 4 elements and Group 14 elements; f satisfies $0<f<0.2$; g represents an absolute value of a charge of $[M^3_{1-f}Mn^{4+}_f F_h]$; and h satisfies $5<h<7$,

wherein $A^{2'}$ contains at least one kind selected from the group consisting of $K^+$, $L^+$, $Na^+$, $Rb^+$, $Cs^+$, and $NH_4^+$; $M^{3'}$ contains at least one element selected from the group consisting of Group 4 elements, Group 13 elements, and Group 14 elements; f' satisfies $0<f'<0.2$; g' represents an absolute value of a charge of $[M^{3'}_{1-f'}Mn^{4+}_{f'}F_{h'}]$; and h' satisfies $5<h'<7$.

9. A light emitting device comprising the wavelength converting member according to claim 6 and an excitation light source.

10. A light emitting device comprising the fluorescent material composite particles according to claim 1 and an excitation light source.

11. Fluorescent material composite particles comprising translucent inorganic particles having a volume average particle diameter in a range of 30 nm or more and 500 nm or less, fluorescent nanoparticles having an average particle diameter in a range of 5 nm or more and 25 nm or less, a first resin, and a film-like material containing an inorganic material transmitting light having a wavelength of 400 nm or more,
- at least a part of each of the translucent inorganic particles being embedded in the first resin,
- the translucent inorganic particles being unevenly distributed to a surface of the fluorescent material composite particles,
- the film-like material being disposed on at least a part of a surface of the translucent inorganic particles,
- the fluorescent material composite particles having a volume average particle diameter in a range of 0.5 μm or more and 50 μm or less,
- wherein the fluorescent nanoparticles contain a compound having a composition represented by the following formula (1):

$$[M^1_d A^1_e]_a M^2_b X_c \quad (1)$$

wherein $M^1$ represents at least one kind of element selected from the group consisting of Cs, Rb, K, Na, and Li; $A^1$ represents at least one kind of cation selected from the group consisting of an ammonium ion, a formamidinium ion, a guanidinium ion, an imidazolium ion, a pyridinium ion, a pyrrolidinium ion, and a protonated thiourea ion; $M^2$ represents at least one kind of element selected from the group consisting of Ge, Sn, Pb, Sb, and Bi; X represents at least one selected from the group consisting of a chloride, a bromide, an iodide, a cyanide, a thiocyanate, an isothiocyanate, and a sulfide; a represents an integer in a range of 1 to 4; b represents an integer in a range of 1 to 2; c represents an integer in a range of 3 to 9; d represents a number in a range of 0 to 1; and e represents a number in a range of 0 to 1, provided that d+e is 1.

12. A method for producing fluorescent material composite particles, comprising:
- preparing a first dispersion liquid containing fluorescent nanoparticles, a radically polymerizable monomer, and a polymerization initiator;
- preparing a second dispersion liquid containing a suspension stabilizer including translucent inorganic particles, and an organic solvent;
- performing suspension polymerization by mixing the first dispersion liquid and the second dispersion liquid,
- in polymerizing the radically polymerizable monomer to form particles of a first resin including the fluorescent nanoparticles, fluorescent material composite particles including the translucent inorganic particles wherein at least a part of each of the translucent inorganic particles is embedded in the first resin and wherein the translucent inorganic particles are unevenly distributed to a surface of the fluorescent material composite particles, being formed through a pickering emulsion including the translucent inorganic particles existing at an oil/oil interface.

13. The method for producing fluorescent material composite particles according to claim 12, wherein the method further comprises attaching a film-like material containing an inorganic material transmitting light having a wavelength of 400 nm or more to at least a part of the surface of the translucent inorganic particles.

14. The method for producing fluorescent material composite particles according to claim 13, wherein the film-like material is attached by a sol-gel method.

15. The method for producing fluorescent material composite particles according to claim 13, wherein the film-like material is attached by an atomic layer deposition method.

16. The method for producing fluorescent material composite particles according to claim 13, wherein the film-like material contains at least one selected from the group consisting of silicon dioxide, aluminum oxide, zirconium oxide, titanium oxide, and magnesium fluoride.

17. The method for producing fluorescent material composite particles according to claim 12, wherein the first dispersion liquid has a content of the fluorescent nanoparticles in a range of 0.5% by mass or more and 10.0% by mass or less, a content of the radically polymerizable monomer in a range of 90% by mass or more and 99.5% by mass or less, and a content of the polymerization initiator in a range of 0.5% by mass or more and 2.0% by mass or less, all based on a total amount of the first dispersion liquid.

18. The method for producing fluorescent material composite particles according to claim 12, wherein the second dispersion liquid contains the translucent inorganic particles in an amount of 0.5 part by mass or more and 10.0 parts by mass or less per 100 parts by mass of the first dispersion liquid.

19. The method for producing fluorescent material composite particles according to claim 12, wherein the organic solvent comprises at least one kind selected from the group consisting of a dimethyl silicone oil, a methylphenyl silicone oil, an organic-modified silicone oil, a hydrofluoroether, and a fluorinated hydrocarbon.

20. The method for producing fluorescent material composite particles according to claim 12, wherein the translucent inorganic particles comprise at least one selected from the group consisting of silicon dioxide, aluminum oxide, zirconium oxide, titanium oxide, and magnesium fluoride.

21. The method for producing fluorescent material composite particles according to claim 12, wherein the radically polymerizable monomer comprises at least one selected from the group consisting of an acrylate, a methacrylate, styrene, butadiene, isoprene, maleic anhydride, a maleic acid derivative, and a fumaric acid derivative.

22. The method for producing fluorescent material composite particles according to claim 12, wherein the fluorescent nanoparticles contain a compound having a composition represented by the following formula (1):

$$[M^1_d A^1_e]_a M^2_b X_c \quad (1)$$

wherein $M^1$ represents at least one kind of element selected from the group consisting of Cs, Rb, K, Na, and Li; $A^1$ represents at least one kind of cation selected from the group consisting of an ammonium ion, a formamidinium ion, a guanidinium ion, an imidazolium ion, a pyridinium ion, a pyrrolidinium ion, and a protonated thiourea ion; $M^2$ represents at least one kind of element selected from the group consisting of Ge, Sn, Pb, Sb, and Bi; X represents at least one selected from the group consisting of a chloride, a bromide, an iodide, a cyanide, a thiocyanate, an isothiocyanate, and sulfide; a represents an integer in a range of 1 to 4; b represents an integer in a range of 1 to 2; c represents an integer in a range of 3 to 9; d represents a number in a range of 0 to 1; and e represents a number in a range of 0 to 1, provided that d+e is 1.

23. A method for producing a wavelength converting member, comprising:

disposing a composition for a wavelength converting sheet containing fluorescent material composite particles produced by the method according to claim 12 and a second resin, on a surface of a translucent member.

24. A method for producing a wavelength converting member, comprising:

disposing a composition for a wavelength converting sheet containing fluorescent material composite particles produced by the method according to claim 12 and a second resin, on a surface of a first translucent member;

disposing a second translucent member to hold the composition for a wavelength converting sheet with the first translucent member; and bonding the first translucent member and the second translucent member with a wavelength converting sheet sandwiched therebetween.

* * * * *